(12) United States Patent
Osawa et al.

(10) Patent No.: US 10,743,410 B2
(45) Date of Patent: Aug. 11, 2020

(54) DISPLAY DEVICE AND INTER-SUBSTRATE CONDUCTING STRUCTURE

(71) Applicant: Japan Display Inc., Tokyo (JP)

(72) Inventors: Shuichi Osawa, Tokyo (JP); Shoji Hinata, Tokyo (JP); Yoshikatsu Imazeki, Tokyo (JP); Yoichi Kamijo, Tokyo (JP); Yoshihiro Watanabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 14 days.

(21) Appl. No.: 15/879,794

(22) Filed: Jan. 25, 2018

(65) Prior Publication Data

US 2018/0213638 A1    Jul. 26, 2018

(30) Foreign Application Priority Data

Jan. 26, 2017    (JP) ................. 2017-012121

(51) Int. Cl.
| | |
|---|---|
| *H05K 1/02* | (2006.01) |
| *H05K 1/11* | (2006.01) |
| *H01B 1/08* | (2006.01) |
| *H05K 1/03* | (2006.01) |
| *H05K 5/00* | (2006.01) |
| *G06F 3/041* | (2006.01) |
| *G02F 1/1333* | (2006.01) |
| *G06F 3/044* | (2006.01) |

(52) U.S. Cl.
CPC ....... *H05K 1/0298* (2013.01); *G02F 1/13338* (2013.01); *G06F 3/044* (2013.01); *G06F 3/0412* (2013.01); *H01B 1/08* (2013.01); *H05K 1/0313* (2013.01); *H05K 1/117* (2013.01); *H05K 5/0017* (2013.01); *G02F 2201/42* (2013.01)

(58) Field of Classification Search
CPC ..... H05K 1/0298; H05K 1/117; G02F 1/1345
See application file for complete search history.

(56) References Cited

U.S. PATENT DOCUMENTS

| | | | |
|---|---|---|---|
| 2009/0027579 A1* | 1/2009 | Aota ................. | G02F 1/134363 349/41 |
| 2015/0255487 A1* | 9/2015 | Yoshida ............... | G02F 1/1345 257/43 |
| 2015/0263314 A1* | 9/2015 | Sakuishi ............ | H01L 51/0097 438/28 |

FOREIGN PATENT DOCUMENTS

JP    2002-040465 A    2/2002

* cited by examiner

*Primary Examiner* — William H. Mayo, III
*Assistant Examiner* — Hiram E Gonzalez
(74) *Attorney, Agent, or Firm* — K&L Gates LLP

(57) ABSTRACT

According to one embodiment, a display device includes a first substrate including a first base member and a first terminal, a second substrate including a second base member including a first surface opposing the first terminal and a second surface on an opposite side to the first surface, a second terminal located on a side of the second surface, and a first hole, an organic insulating layer located between the first terminal and the second base member and including a second hole connecting to the first hole and a connecting material provided on the first hole to electrically connect the first terminal and the second terminal to each other, at least one of the first terminal and the second terminal including an oxide electrode in contact with the connecting material.

23 Claims, 16 Drawing Sheets

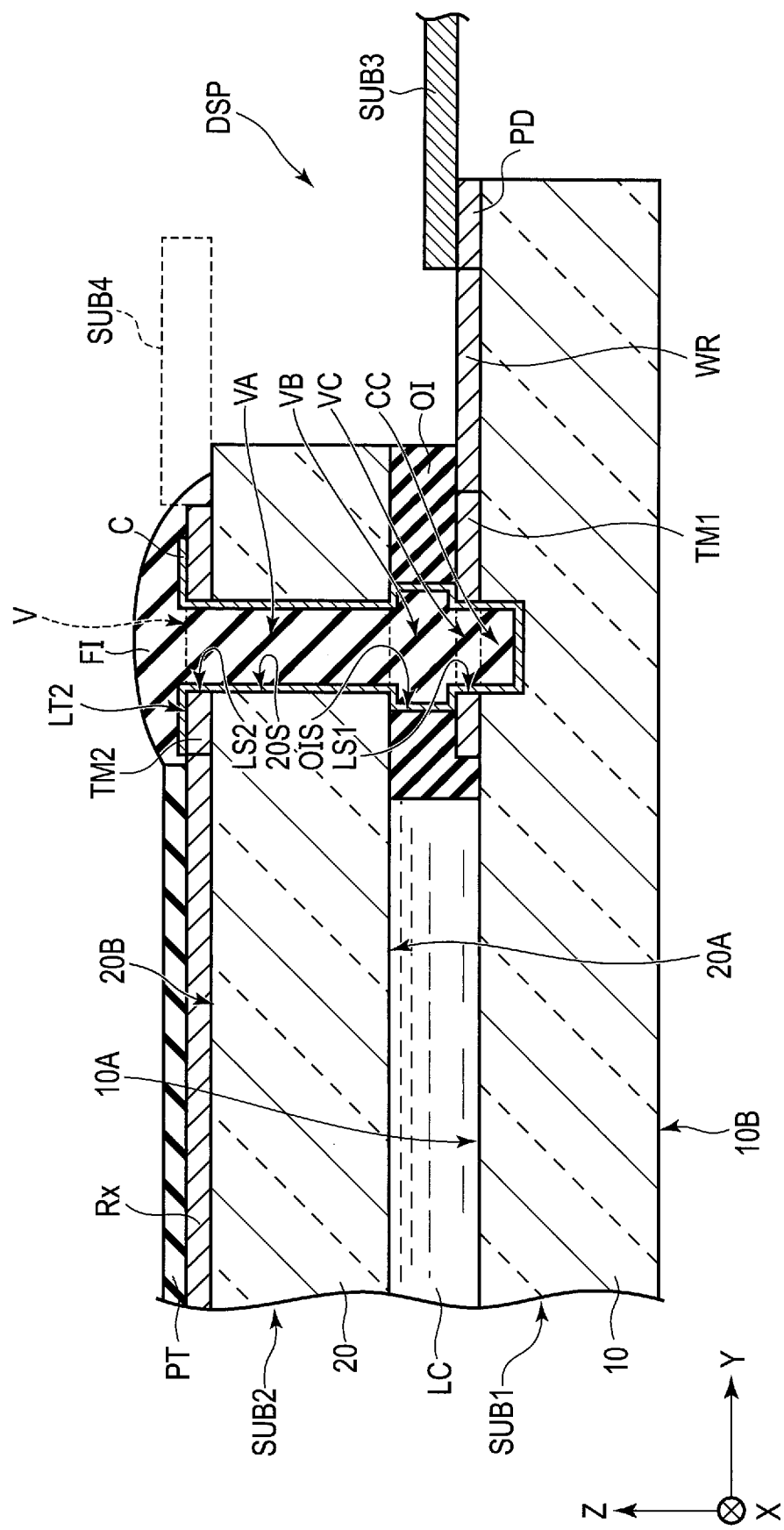
F I G. 1

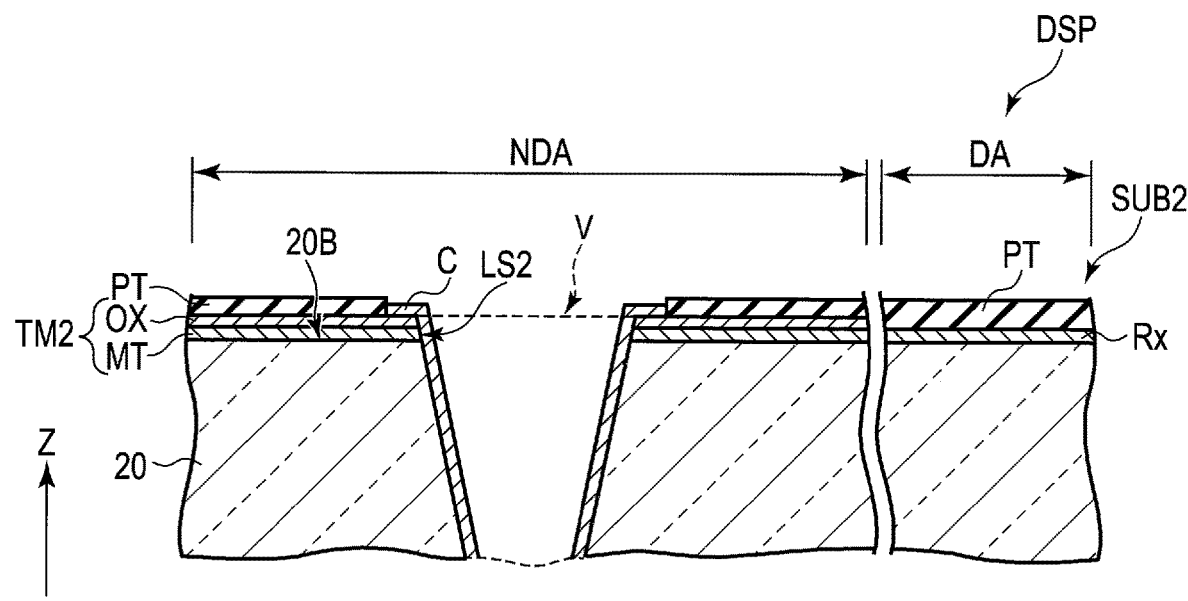
F I G. 2
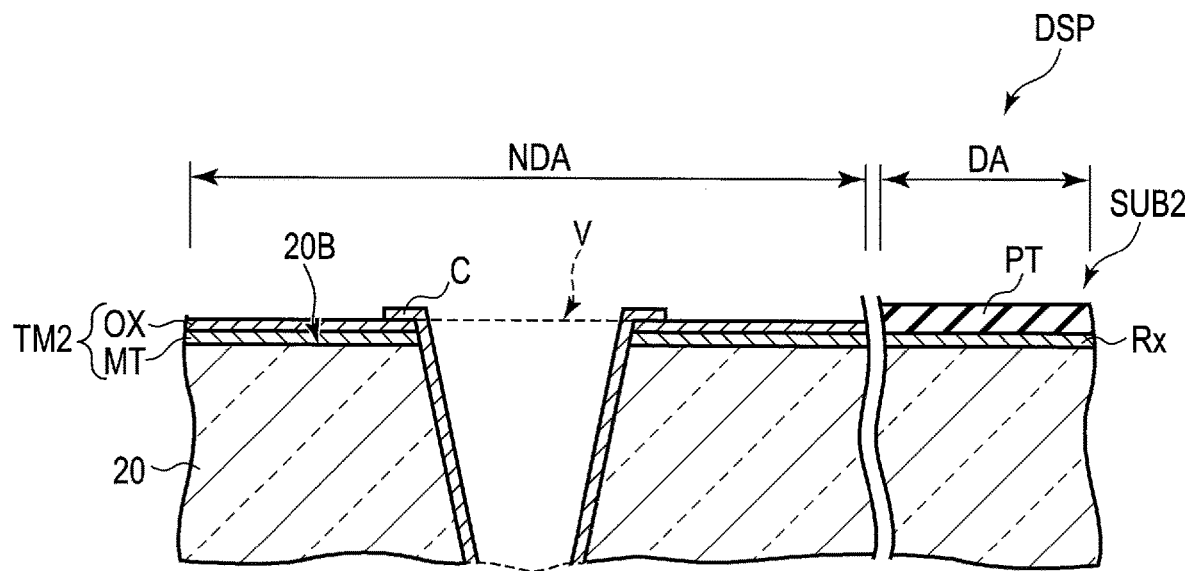
F I G. 3

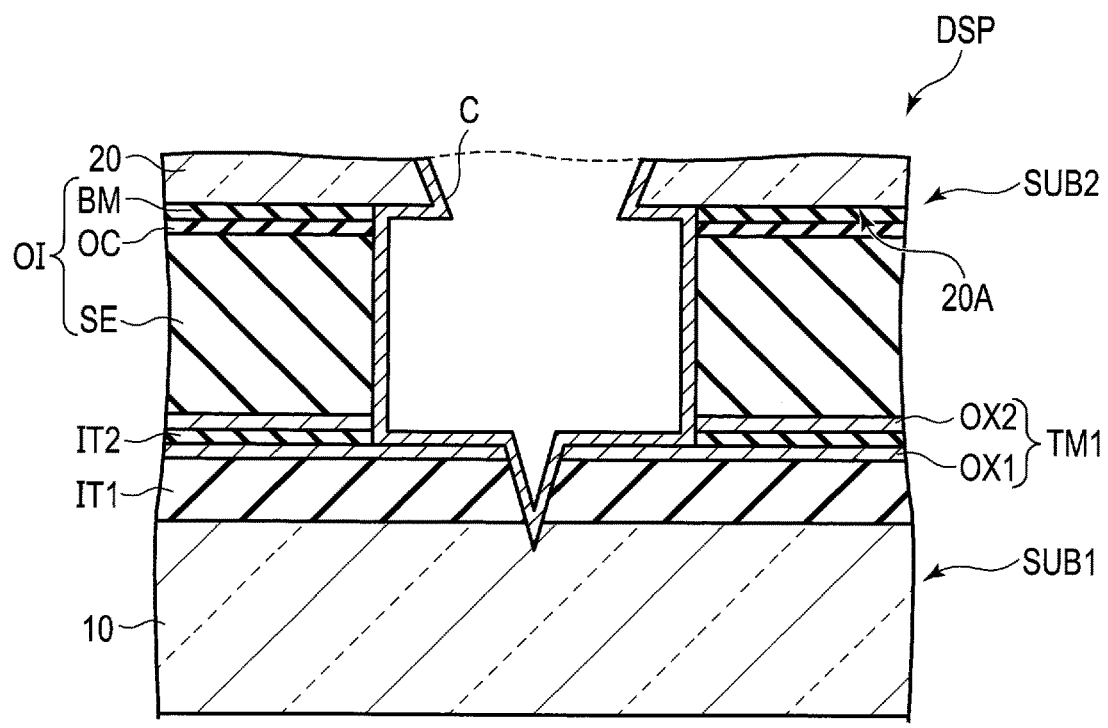
F I G. 6
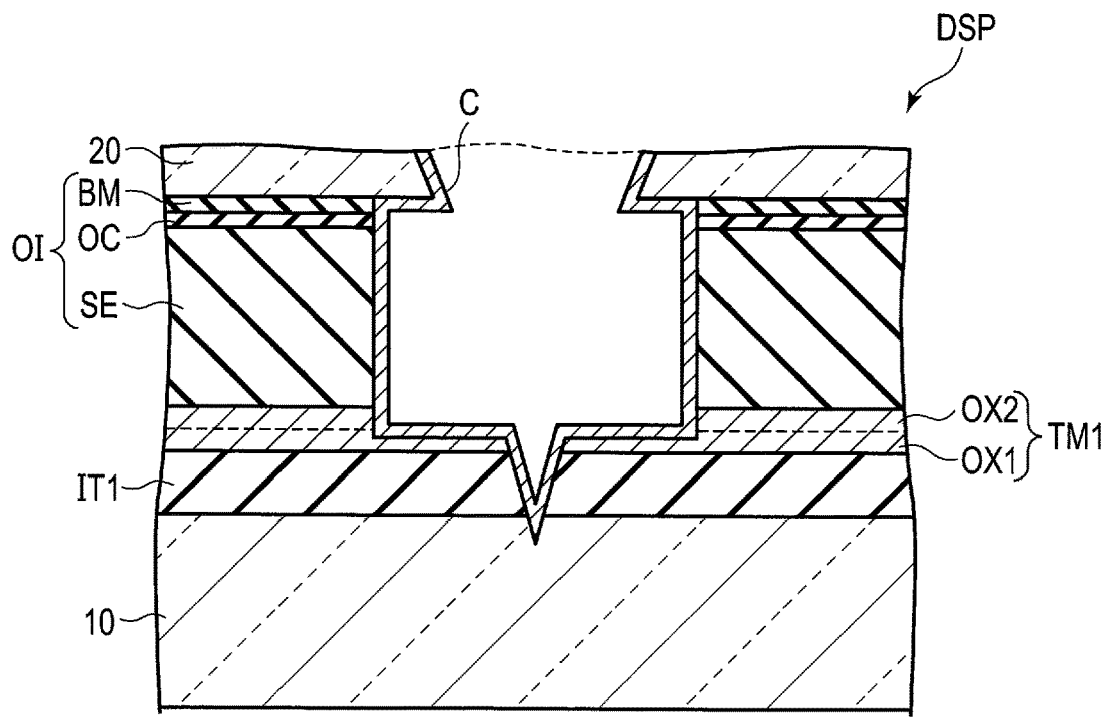
F I G. 7

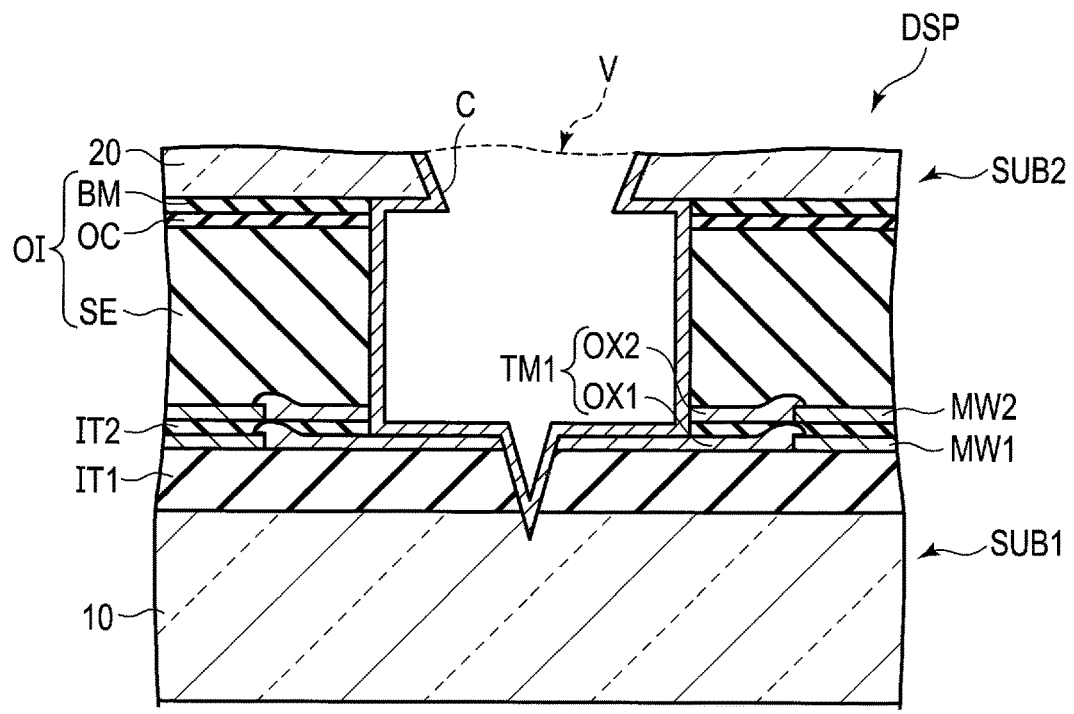
F I G. 8
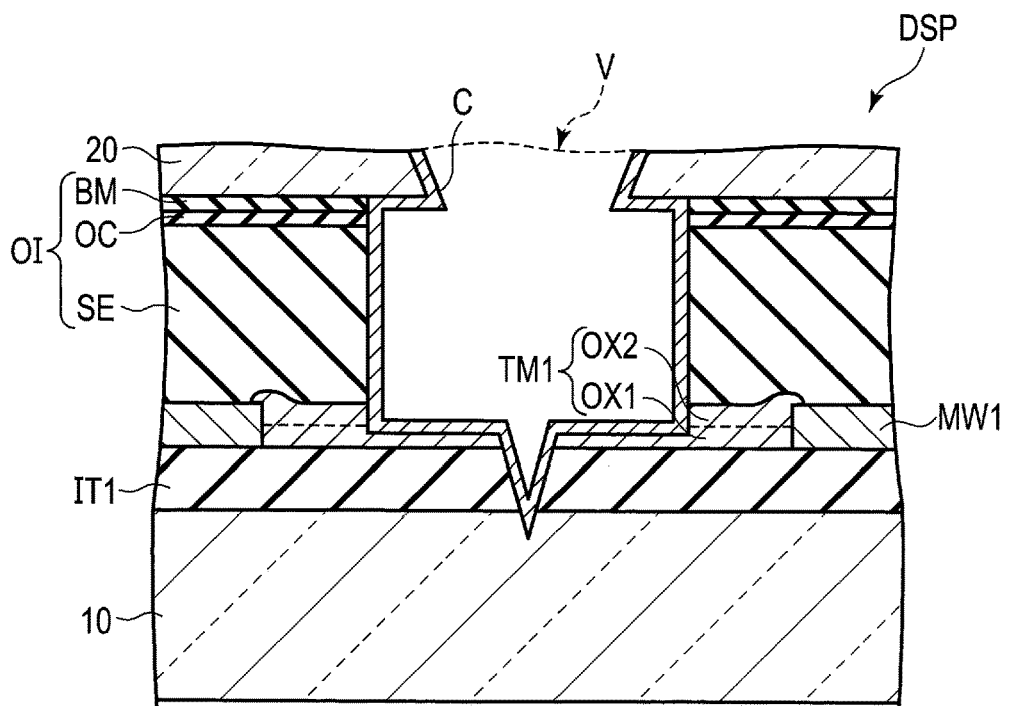
F I G. 9

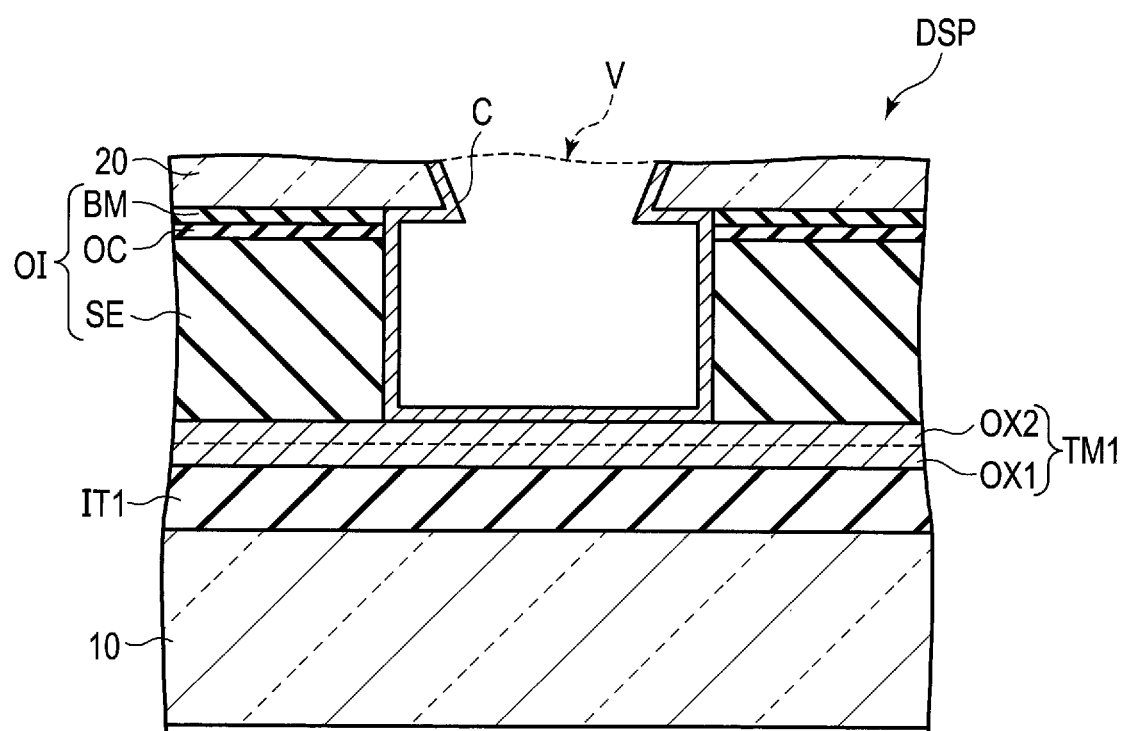
F I G. 10

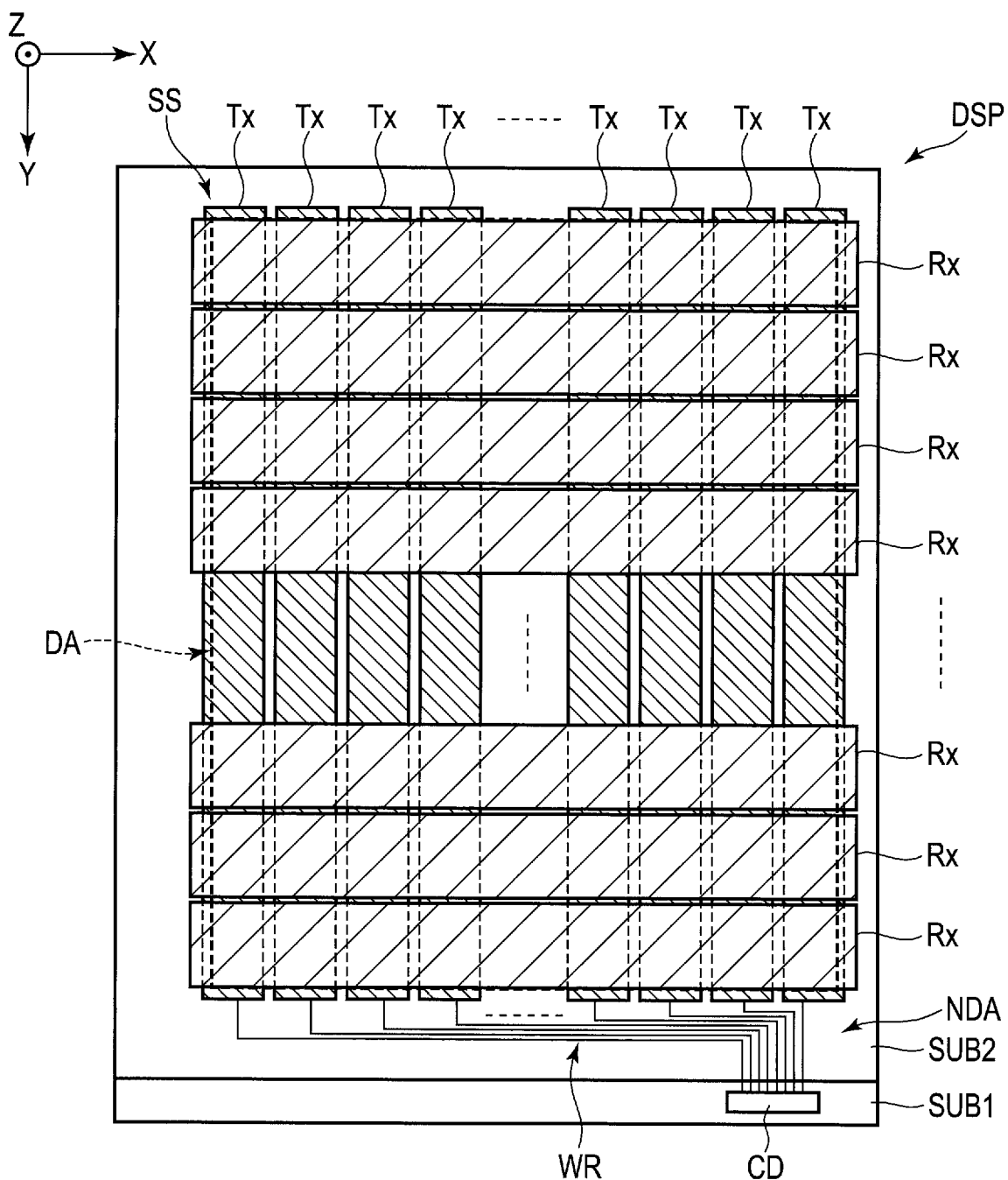
F I G. 14

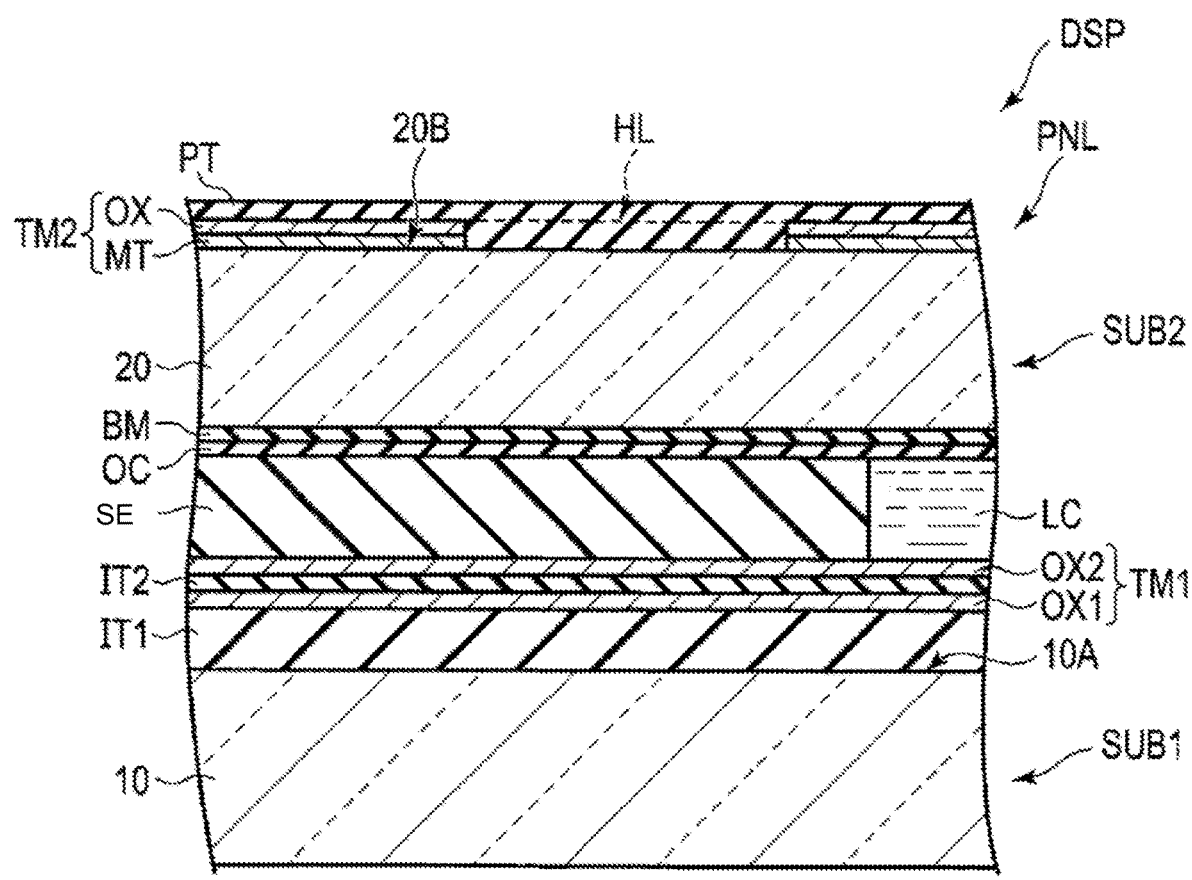
F I G. 17

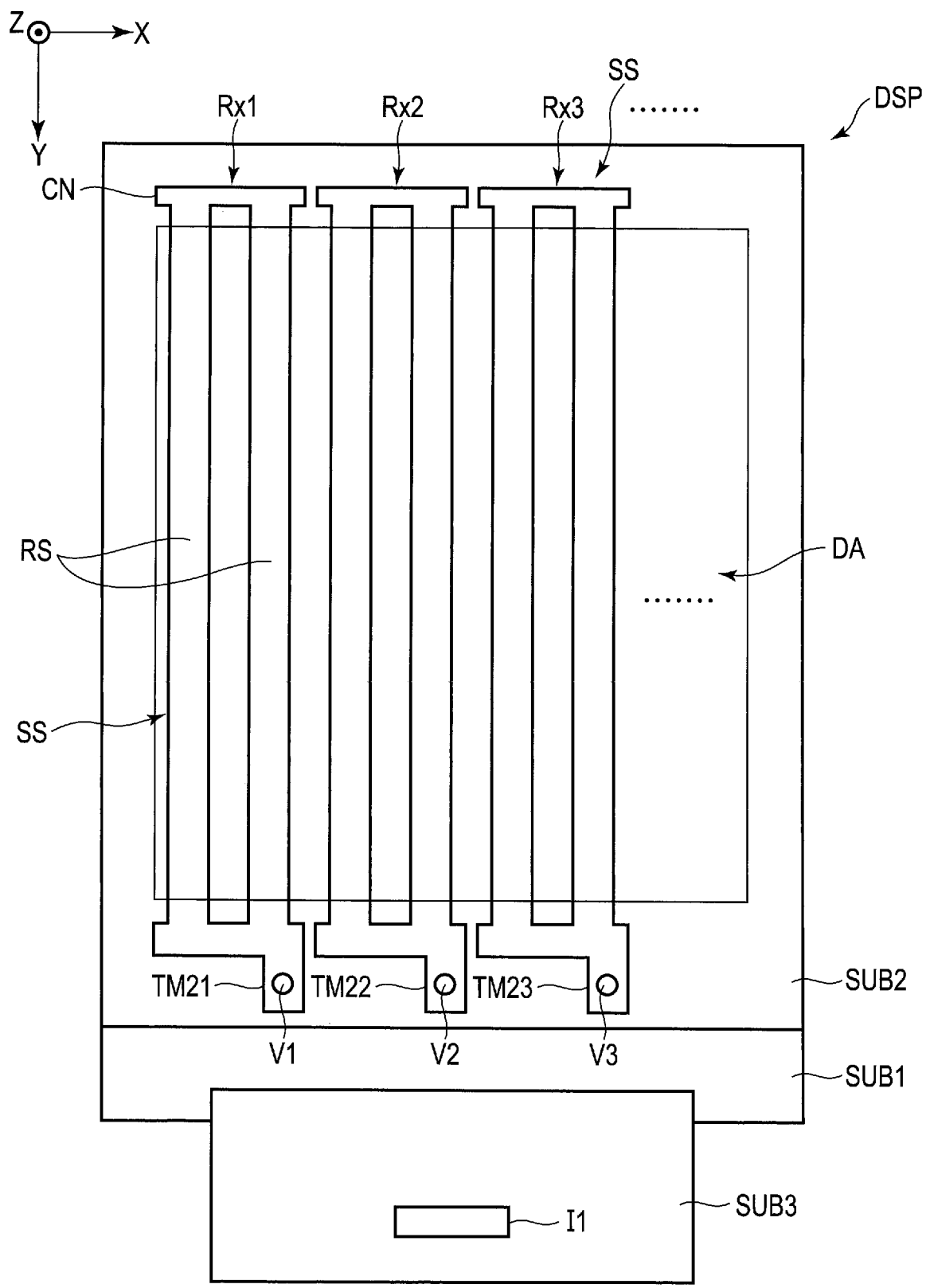
F I G. 24

DISPLAY DEVICE AND INTER-SUBSTRATE CONDUCTING STRUCTURE

CROSS-REFERENCE TO RELATED APPLICATIONS

This application is based upon and claims the benefit of priority from Japanese Patent Application No. 2017-012121, filed Jan. 26, 2017, the entire contents of which are incorporated herein by reference.

FIELD

Embodiments described herein relate generally to a display device and an inter-substrate conducting structure.

BACKGROUND

In recent years, various techniques for reducing the width of the frame in display devices are being studied. One example discloses a technique of utilizing another connector (inter-substrate connector) which electrically connects a wiring portion comprising a contact-hole connecting material inside a hole which penetrates an inner surface and an outer surface of a resin-made first substrate, and a wiring portion provided on an inner surface of a resin-made second substrate to each other.

SUMMARY

The present application generally relates to a display device and an inter-substrate conducting structure.

According to one embodiment, a display device includes a first substrate including a first base member and a first terminal, a second substrate including a second base member including a first surface opposing the first terminal and a second surface on an opposite side to the first surface, a second terminal located on a side of the second surface, and a first hole, an organic insulating layer located between the first terminal and the second base member and including a second hole connecting to the first hole and a connecting material provided on the first hole to electrically connect the first terminal and the second terminal to each other, at least one of the first terminal and the second terminal including an oxide electrode in contact with the connecting material.

BRIEF DESCRIPTION OF THE DRAWINGS

FIG. 1 is a cross-sectional view showing a configuration example of a display device of an embodiment.

FIG. 2 is a cross-sectional view showing an example of a second substrate shown in FIG. 1.

FIG. 3 is a cross-sectional view showing an example of the second substrate shown in FIG. 1.

FIG. 6 is a cross-sectional view showing an example of the display device shown in FIG. 1.

FIG. 7 is a cross-sectional view showing an example of the display device shown in FIG. 1.

FIG. 8 is a cross-sectional view showing an example of the display device shown in FIG. 1.

FIG. 9 is a cross-sectional view showing an example of the display device shown in FIG. 1.

FIG. 10 is a cross sectional view showing an example of the display device DSP shown in FIG. 1.

FIG. 14 is a plan view showing a configuration example of a sensor.

FIG. 17 is a diagram showing a processing step in the example of the method of manufacturing the display device of the embodiment.

FIG. 24 is a diagram showing a processing step in the example of the method of manufacturing the display device of the embodiment.

DETAILED DESCRIPTION

Figure 4:
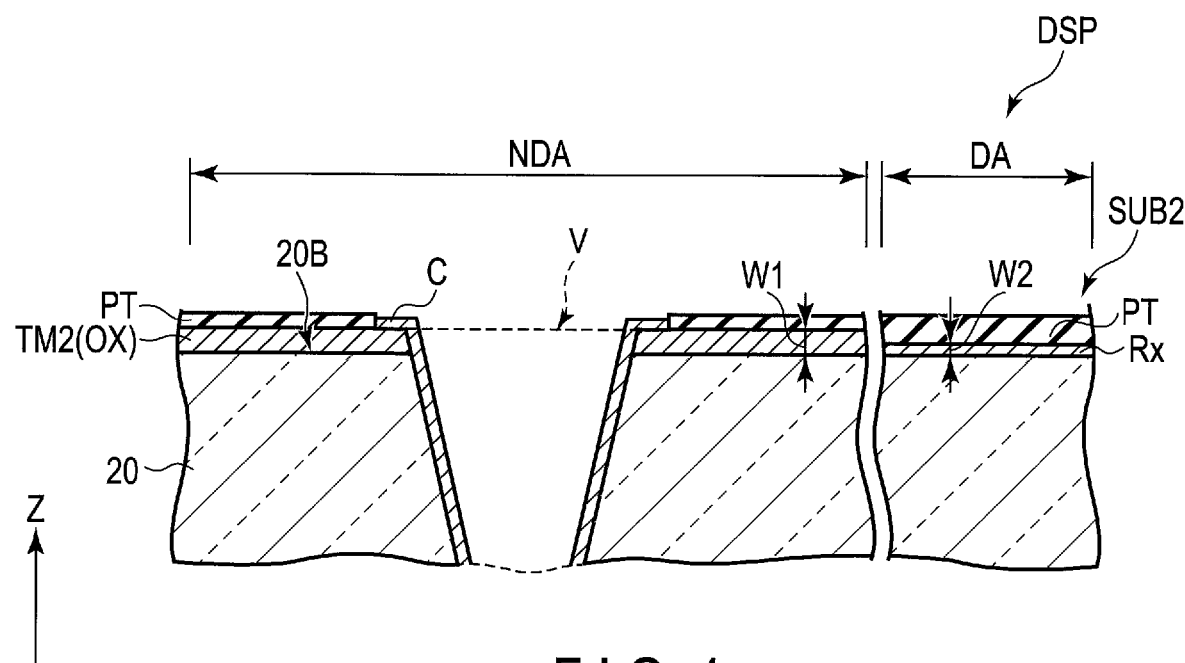
FIG. 4 is a cross-sectional view showing an example of s second substrate shown in FIG. 1.

In general, according to one embodiment, a display device is provided, which comprises a first substrate comprising a first base member and a first terminal, a second substrate comprising a second base member comprising a first surface opposing and spaced apart from the first terminal and a second surface on an opposite side to the first surface, a second terminal located on a side of the second surface, and a first hole which penetrates from the first surface to the second surface, an organic insulating layer located between the first terminal and the second base member and comprising a second hole connecting to the first hole and a connecting material provided on the first hole to electrically connect the first terminal and the second terminal to each other, at least one of the first terminal and the second terminal including an oxide electrode in contact with the connecting material.

According to another embodiment, a display device is provided, which comprises a first substrate comprising a first base member, a first terminal and a first interlayer insulating layer located between the first base member and the first terminal, a second substrate comprising a second base member comprising a first surface opposing and spaced apart from the first terminal and a second surface on an opposite side to the first surface, a second terminal located on a side of the second surface, and a first hole which penetrates from the first surface to the second surface, an organic insulating layer located between the first terminal and the second base member and comprising a second hole connecting to the first hole and a connecting material provided on the first hole to electrically connect the first terminal and the second terminal to each other, the first terminal comprising a first oxide electrode located on the first interlayer insulating layer, a second oxide electrode located above the first oxide electrode, and a second interlayer insulating layer located between the first oxide electrode and the second oxide electrode, the second terminal comprising a metal layer in contact with the second surface and a third oxide electrode in contact with the metal layer, and the first oxide electrode, the second oxide electrode, and the third oxide electrode are in contact with the connecting material.

According to another embodiment, an inter-substrate conducting structure is provided, which comprises a first substrate comprising a first base member and a first terminal, a second substrate comprising a second base member comprising a first surface opposing and spaced apart from the first terminal and a second surface on an opposite side to the first surface, a second terminal located on a side of the second surface, and a first hole which penetrates from the first surface to the second surface, an organic insulating layer located between the first terminal and the second base member and comprising a second hole connecting to the first hole and a connecting material provided on the first hole to electrically connect the first terminal and the second terminal to each other, at least one of the first terminal and the second terminal including an oxide electrode in contact with the connecting material.

Embodiments will now be described with reference to accompanying drawings. Note that the disclosure is presented for the sake of exemplification, and any modification and variation conceived within the scope and spirit of the invention by a person having ordinary skill in the art are naturally encompassed in the scope of invention of the present application. Further, a width, thickness, shape, and the like of each element are depicted schematically in the figures as compared to actual embodiments for the sake of simpler explanation, and they do not limit the interpretation of the invention of the present application. Furthermore, in the description and figures of the present application, structural elements having the same or similar functions will be referred to by the same reference numbers and detailed explanations of them that are considered redundant may be omitted.

In the embodiment, a display device will be disclosed as an example of the electronic device. The display device can be used in, for example, various types of equipment such as smartphones, tablet terminals, mobile telephone terminals, notebook personal computers, and game consoles. The major configuration explained in the present embodiment can also be applied to a liquid crystal device, a self-luminous display device comprising an organic electroluminescent display element, and the like, an electronic paper display device comprising an electrophoretic element, and the like, a display device employing micro-electromechanical systems (MEMS), or a display device employing electro-chromism.

FIG. 1 is a cross sectional view showing a configuration example of a display device DSP of this embodiment. A first direction X, a second direction Y, and a third direction Z are orthogonal to each other, but they may cross at an angle other than 90 degrees. The first direction X and the second direction Y are parallel to a surface of a substrate of the display device DSP, and the third direction Z is a thickness direction of the display device DSP. Here, FIG. 1 shows a cross sectional view of a part of the display device DSP in an X-Y plane defined by the first direction X and the second direction Y.

The display device DSP comprises a first substrate SUB1, a second substrate SUB2, an organic insulating layer OI, a liquid crystal layer LC, a wiring substrate SUB3, a connecting material C, and a filing material FI. The first substrate SUB1 and the second substrate SUB2 oppose the third direction Z. In the following descriptions, the direction from the first substrate SUB1 towards the second substrate SUB2 is defined as above (or simply up), and the direction from the second substrate SUB2 towards the first substrate SUB1 is defined as below (or simply down). Viewing from the second substrate SUB2 towards the first substrate SUB1 is defined as planar view.

The first substrate SUB1 comprises a first base member 10, a first terminal TM1, a wiring line WR, and a pad electrode PD. The first base member 10 comprises a surface 10A opposing the second substrate SUB2 and another surface 10B on an opposite side to the surface 10A. In the example illustrated, the first terminal TM1, wiring line WR, and pad electrode PD are located on a surface 10A side. The wiring line WR is disposed between the first terminal TM1 and the pad electrode PD. The first terminal TM1 and the pad electrode PD are electrically connected to each other via the wiring line WR. Although not illustrated in the figure, various types of insulating layers and conducting layers may be disposed between the first base member 10 and a group of the first terminal TM1, wiring line WR and pad electrode PD, and on the first terminal TM1, the wiring line WR and the pad electrode PD. Further, the first terminal TM1, the wiring line WR, and the pad electrode PD may be formed in layers separate from each other via an insulating layer or the like. Note that the first base member 10 corresponds to a first insulating substrate, and the second base member 20 corresponds to a second insulating substrate. As the first insulating substrate and second insulating substrate, resin substrates can be adopted.

The second substrate SUB2 comprises a second base member 20, a second terminal TM2, a detection electrode Rx and a protection material PT. The second base member 20 comprises a surface 20A opposing the first substrate SUB1 and another surface 20B on an opposite side to the surface 20A. The surface 20A opposes the first terminal TM1 and is spaced apart from the first terminal TM1 along the third direction Z. The first base member 10 and the second base member 20 are formed from, for example, no-alkali glass. In the example illustrated, the second terminal TM2 and the detection electrode Rx are located on a surface 20B side. The second terminal TM2 and the detection electrode Rx are electrically connected to each other. The protection material PT is disposed on the detection electrode Rx. The protection material PT may be disposed on the second terminal TM2 as well. Although not illustrated, various types of insulating layers and conducting layers may be provided between the second base member 20 and a group of the second terminal TM2 and detection electrode Rx.

The organic insulating layer OI is located between the first terminal TM1 and the second base member 20. In the example illustrated, the organic insulating film OI is in contact also with the first base member 10 and the wiring line WR. Here, the organic insulating layer OI includes, for example, a light-shielding layer, a color filter, an overcoat layer, and an alignment film, which will be described later, and also a sealing material which attaches the first substrate SUB1 and the second substrate SUB2 to each other. The liquid crystal layer LC is located in the region surrounded by the first substrate SUB1, the second substrate SUB2 and the sealing material SE.

A wiring substrate SUB3 is mounted on the first substrate SUB1 so as to be electrically connected to the pad electrode PD. The wiring substrate SUB3 having such configuration is, for example, a flexible substrate with flexibility. Note that a flexible substrate applicable to this embodiment should only comprise at least partially a flexible portion of a bendable material. For example, the wiring substrate SUB3 of this embodiment each may be a flexible substrate in its entirety, or may be a rigid flexible substrate comprising a rigid portion formed of a rigid material such as glass epoxy and a flexible portion formed of a bendable material such as polyimide.

Here, a connection structure between the first terminal TM1 and the second terminal TM2 in this embodiment will be described in detail.

In the second substrate SUB2, the second base member 20 comprises a hole (first hole) VA which penetrates between the surface 20A and the surface 20B. In the example illustrated, the hole VA penetrates the second terminal TM2 as well.

Between the first substrate SUB1 and the second substrate SUB2, the organic insulating film OI comprises a hole (second hole) VB communicated to the hole VA.

On the other hand, in the first substrate SUB1, the first terminal area TM1 comprises a hole VC connected to the hole VB. Further, the first glass substrate 10 comprises a concavity CC opposing the hole VC along the third direction Z. The concavity CC 1 is formed from the surface 10A toward the surface 10B, but in the example illustrated, it does not penetrate to the surface 10B. For example, the depth of the concavity CC along the third direction Z is about ⅕ to ½ of the thickness of the first base member 10 along the third direction Z. Note that the first base member 10 may comprise a hole which penetrates between the surface 10A and the surfaces 10B in place of the concavity CC. Each of the hole VC and the concavity CC is located directly under the hole VA. The holes VA, VB, VC and the concavity CC are located in the same straight line along the third direction Z, and form the contact hole V.

In the example illustrated, the hole VB is expanded in the second direction Y as compared to the holes VA and VC. The hole portion VB is expanded not only in the second direction Y but also in all directions in the X-Y plane further than the holes VA and VC.

The connecting material C is provided through the holes VA and VB to electrically connect the first terminal TM1 and the second terminal TM2 to each other. More specifically, the connecting material C is formed on inner surfaces of the holes VA, VB, VC and the concavity CC. In the example illustrated, the connecting material C are formed without interruption in through the holes VA, VB, VC and the concavity CC. The connecting material C should preferably contain a metal material such as silver and fine particles having a diameter of the order of from several nanometers to tens of nanometers, with which the metal material is mixed. Note that the solvent of the connecting material C evaporates in the manufacturing process, and therefore the connecting material C attaching to the wall surface of the contact hole V may be a thin film of a metal material.

In the example illustrated, the connecting material C is in contact with each of an upper surface LT2 and inner surfaces LS2 of the second terminal TM2 and an inner surface 20S of the second base member 20. The inner surfaces LS2 and 20S form the inner surface of the hole VA. The connecting material C is in contact with an inner surface OIS of the organic insulating layer OI. The inner surface OIS forms an inner surface of the hole VB. Further, the connecting material C is also in contact with each of the inner surface LS1 of the first terminal TM1 and the concavity CC 1. The inner surface LS1 forms the inner surface of the hole VC.

In the example illustrated, the connecting material C is provided on the inner surfaces of the holes VA, VB, VC and the concavity CC, but it may fill up the holes VA, VB, VC and the concavity CC to be buried. In this case as well, the connecting material C is formed continuously without interruption between the first terminal TM1 and the second terminal TM2.

A hollow section of the contact hole V is filled with a filling material FI. Further, the filling material FI is disposed above the second terminal TM2 as well to cover the connecting material C and the second terminal TM2. The filling material FI has, for example, insulating properties, and is formed from an organic insulating material. Thus, with the filling material FI, a level difference along the third direction Z resulting from the hollow portion formed in the contact hole V can be reduced. Further, the connecting material C can be protected. Moreover, the filling material FI may have conductivity and, for example, may be a material obtained by hardening a paste containing conductive particles such as of silver. In the case where the filling material FI has conductivity, even if the connecting material C is broken off, the filling material FI can electrically connect the first terminal TM1 and the second terminal TM2 to each other, thereby making it possible to improve the reliability.

With the above-described structure, the second terminal TM2 is electrically connected to the wiring substrate SUB3 via the connecting material C, the first terminal TM1 and the like. Thus, control circuits for writing signals to the detection electrode Rx or reading signals output therefrom are electrically connected to the detection electrode Rx via the wiring substrate SUB3. In other words, in order to connect the detection electrode Rx and the control circuits to each other, it is no longer necessary to provide a wiring substrate SUB4, indicated by dotted line in FIG. 1, in the second substrate SUB2.

Further, in this embodiment, at least one of the first terminal TM1 and the second terminal TM2 includes an oxide electrode in contact with the connecting material C. For example, the first terminal TM1 may be formed entirely from an oxide electrode, or may include an oxide electrode on an inner surface LS1 side, which is in contact with the connecting material C, which will be described later. Here, for example, the second terminal TM2 may be formed entirely from a metal material or the like, or may include an oxide electrode. Moreover, for example, the second terminal TM2 may be formed entirely from an oxide electrode or may include an oxide electrode on an inner surface LS2 side, which is in contact with the connecting material C. Here, for example, the first terminal TM1 may be formed entirely from a metal material or the like or may include an oxide electrode. Moreover, the first terminal TM1 and the second terminal TM2 may be of a multilayer structure, and in this case, the top layer may be formed from an oxide electrode, which will be described later.

Note that when the first terminal TM1 and the second terminal TM2 include an oxide electrode, the parts other than the oxide electrode in the first terminal TM1 and the second terminal TM2 are formed of, for example, a metal material or the like.

In the example illustrated, the first terminal TM1 and the second terminal TM2 are oxide electrodes formed from, for example, a transparent conductive material such as indium tin oxide (ITO), indium gallium oxide (IGO) or indium zinc oxide (IZO).

According to this embodiment, at least one of the first terminal TM1 and second terminal TM2 includes an oxide electrode in contact with the connecting material C. With this structure, as compared to the case where the first terminal TM1 and the second terminal TM2 are formed from a metal material, it is possible to prevent the first terminal TM1 and the second terminal TM2 from being oxidized. Thus, it is possible to suppress the resistance of the first terminal TM1 and the second terminal TM2 from increasing with time.

Further, as compared to the example in which a wiring substrate SUB4 is mounted in the second substrate SUB2 in addition to the wiring substrate SUB3 mounted in the first substrate SUB1, this embodiment no longer requires the terminal for mounting the wiring substrate SUB4 or the routing line for connecting the second terminal TM2 and the wiring substrate SUB4 to each other. Therefore, the size of the second substrate SUB2 in the X-Y plane defined by the first direction X and the second direction Y can be reduced, and also the width of the frame in the peripheral portion of the display device DSP can be decreased. Further, the cost for the wiring substrate SUB4, which is no longer necessary, can be reduced. Thus, the width of the frame can be reduced and a low-cost can be achieved.

FIG. 2 is a cross-sectional view showing an example of second substrate SUB2 shown in FIG. 1.

As will be described later, the display device DSP comprises a display area DA which displays images and a non-display area NDA surrounding the display area DA. In the example illustrated, the detection electrode Rx is located in the display area DA. The second terminal TM2 and the contact hole V are located in the non-display area NDA.

The second terminal TM2 comprises a metal layer MT in contact with the surface 20B and an oxide electrode OX disposed on the metal layer MT. The metal layer MT may be formed from, for example, a metal material containing molybdenum or aluminum, or an alloy in combination of these, and may be of a single- or multi-layer structure. Further, the metal layer MT may be formed in and by the same process and the same material as those of the detection electrode Rx. The oxide electrode OX is in contact with the metal layer MT. Furthermore, the oxide electrode OX is in contact with the connecting material C on the inner surface LS2. The protection component PT is formed continuously in from the display area DA to the non-display area NDA. The protection component PT is disposed on the detection electrode Rx in the display area DA, and on the second terminal TM2 in the non-display area NDA. That is, the protection component PT is in contact with the oxide electrode OX.

With this structure, the advantages described above can be obtained.

FIG. 3 is a cross-sectional view showing an example of the second substrate SUB2 shown in FIG. 1.

The structure shown in FIG. 3 is different from that of FIG. 2 in that the protection component PT is not disposed on the second terminal TM2 in the non-display area NDA. In this case as well, since the second terminal TM2 comprises an oxide electrode OX which covers the metal layer MT, it is possible to suppress the second terminal TM2 from being oxidized.

With this structure, the advantages described above can be obtained.

FIG. 4 is a cross-sectional view showing another example of the second substrate SUB2 shown in FIG. 1.

The structure shown in FIG. 4 is different from that of FIG. 2 in that the entire second terminal TM2 is the oxide electrode OX. The oxide electrode OX is in contact with the surface 20B. Here, the second terminal TM2 has a thickness W1 along the third direction Z, and the detection electrode Rx has a thickness W2 along the third direction Z. The thickness W1 is greater than the thickness W2. For example, the thickness W1 is substantially equal to the thickness of the second terminal TM2 shown in FIG. 2 along the third direction Z.

With this structure, the advantages described above can be obtained.

Figure 5:
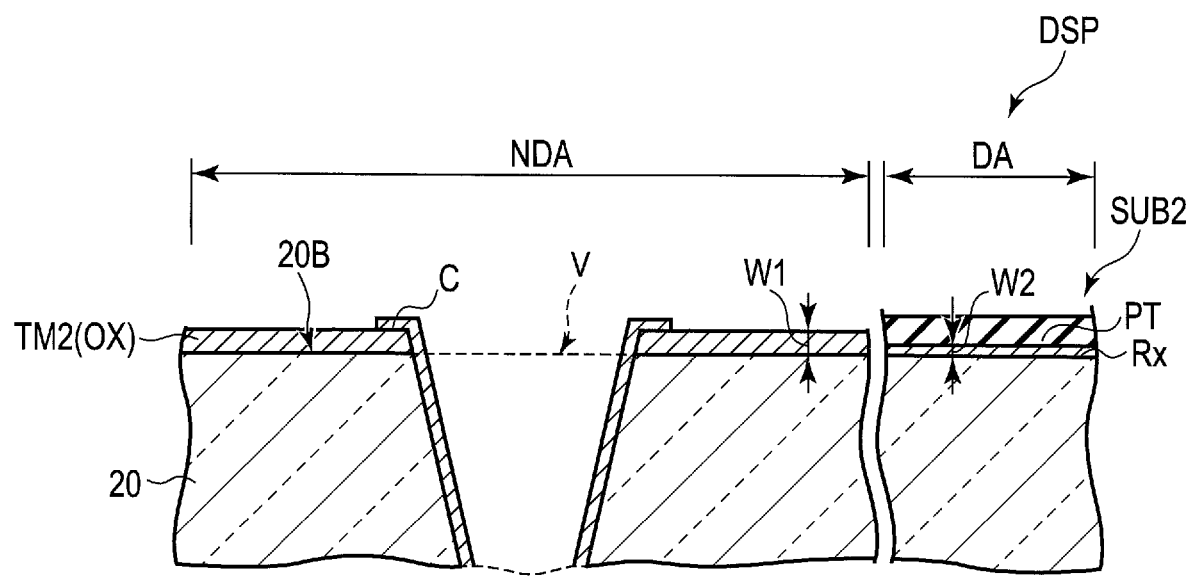
FIG. 5 is the cross-sectional view showing an example of s second substrate shown in FIG. 1.

FIG. 5 is a cross-sectional view showing an example of the second substrate SUB2 shown in FIG. 1.

The structure shown in FIG. 5 is different from that of FIG. 4 in that the protection component PT is not disposed on the second terminal TM2 in the non-display area NDA. In this case as well, since the second terminal TM2 is the oxide electrode OX, and therefore its oxidization can be suppressed.

With this structure, the advantages described above can be obtained.

FIG. 6 is a cross-sectional view showing an example of the display device DSP shown in FIG. 1. In the example illustrated, the display device DSP comprises a first substrate SUB1, a second substrate SUB2 and sealing material SE.

In the example illustrated, the first substrate SUB1 comprises a first base member 10, a first interlayer insulating film IT1, a second interlayer insulating film IT2 and a first terminal TM1. The first interlayer insulating film IT1 is located between the first base member 10 and the first terminal TM1. The first terminal TM1 comprises a first oxide electrode OX1 located on the first interlayer insulating film IT1 and a second oxide electrode OX2 located above the first oxide electrode OX1. The first oxide electrode OX1 and the second oxide electrode OX2 are in contact with the connecting material C. The second interlayer insulating film IT2 is located between the first oxide electrode OX1 and the second oxide electrode OX2.

The first interlayer insulating film IT1 is an organic insulating film formed from, for example, an organic material and the second interlayer insulating film IT2 is an inorganic insulating film formed from, for example, an inorganic material. Further, the first oxide electrode OX1 and the second oxide electrode OX2 are formed in and by the same process and the same material as those of, for example, the common electrode and the pixel electrode, which will be described later. Here, the second interlayer insulating film IT2 is formed in and by the same process and the same material as those of, for example, the interlayer insulating film between the common electrode and the pixel electrode.

In the example illustrated, the second substrate SUB2 comprises a second base member 20, a light-shielding layer BM and an overcoat layer OC. The light-shielding layer BM is located on the surface 20A. The overcoat layer OC covers the light-shielding layer BM.

The sealing material SE is provided between the first substrate SUB1 and the second substrate SUB2 to attach the first substrate SUB1 and the second substrate SUB2 together. Here, the organic insulating film OI corresponds to the light-shielding layer BM, the overcoat layer OC and the sealing material SE. In the example illustrated, the contact hole V penetrates even to the first base member 10.

With this structure, the advantages described above can be obtained.

FIG. 7 is a cross-sectional view showing another example of the display device DSP shown in FIG. 1. The structure shown in FIG. 7 is different from that of FIG. 6 in that the second interlayer insulating film IT2 is not disposed between the first oxide electrode OX1 and the second oxide electrode OX2. That is, the second oxide electrode OX2 is in contact with the first oxide electrode OX1. That is to say, the first terminal TM1 may be formed by the oxide electrode of single layer.

With this structure, the advantages described above can be obtained.

FIG. 8 is a cross-sectional view showing another example of the display device DSP shown in FIG. 1. The structure shown in FIG. 8 is different from that of FIG. 6 in that the first substrate SUB1 comprises metallic wiring lines MW1 and MW2 connected to the first terminal TM1.

The first oxide electrode OX1 and the second oxide electrode OX2 are disposed around the contact hole V to be in contact with the connecting material C. The metallic wiring line MW1 is disposed on the first interlayer insulating film IT1 and is electrically connected to the first oxide electrode OX1. Further, the metallic wiring MW2 is disposed on the second interlayer insulating film IT2 and is electrically connected to the second oxide electrode OX2. Note that ends of the first oxide electrode OX1 and the second oxide electrode OX2 are located on ends of the metallic wiring lines MW1 and MW2, respectively. That is, for example, the first oxide electrode OX1 and the second oxide electrode OX2 are formed after the metallic wiring lines MW1 and MW2 are formed.

According to the structure shown in FIG. 8, the metallic wiring lines MW1 and MW2 formed from a metal having resistance lower than that of the oxide electrode are disposed around the first oxide electrode OX1 and the second oxide electrode OX2. Thus, it is possible to lower the resistance of the layer in which the first oxide electrode OX1 and the metallic wiring line MW1 are provided, and also the resistance of the layer in which the second oxide electrode OX2 and the metallic wiring line MW2 are provided, as compared to the structure shown in FIG. 6.

With this structure, the advantages described above can be obtained.

FIG. 9 is a cross-sectional view showing another example of the display device DSP shown in FIG. 1. The structure shown in FIG. 9 is different from that of FIG. 7 in that the first substrate SUB1 comprises a metallic wiring line MW1 connected to the first terminal TM1.

The first terminal TM1 is disposed around the contact hole V so as to be in contact with the connecting material C. The metallic wiring line MW1 is disposed on the first interlayer insulating film IT1 and is electrically connected to the first terminal TM1. Thus, it is possible to lower the resistance of the layer in which the first terminal TM1 and the metallic wiring line MW1 are provided, as compared to the structure shown in FIG. 7.

With this structure, the advantages described above can be obtained.

FIG. 10 is a cross-sectional view showing another example of the display device DSP shown in FIG. 1. The structure shown in FIG. 10 is different from that of FIG. 7 in that the contact hole V does not penetrate to the first base member 10, as compared with the structure shown in FIG. 7.

In the example illustrated, the contact hole V penetrates to the first terminal TM1. The connecting material C is in contact with an upper surface of the first terminal TM1.

With this structure, the advantageous described above can be obtained.

Note that the structures shown in FIGS. 6 to 10 may be combined with the structure of any of those shown in FIGS. 2 to 5. Moreover, the oxide electrode OX, the first oxide electrode OX1 and the second oxide electrode OX2 may be subjected to a treatment such as polycrystallization in order to lower the resistance.

Figure 11:
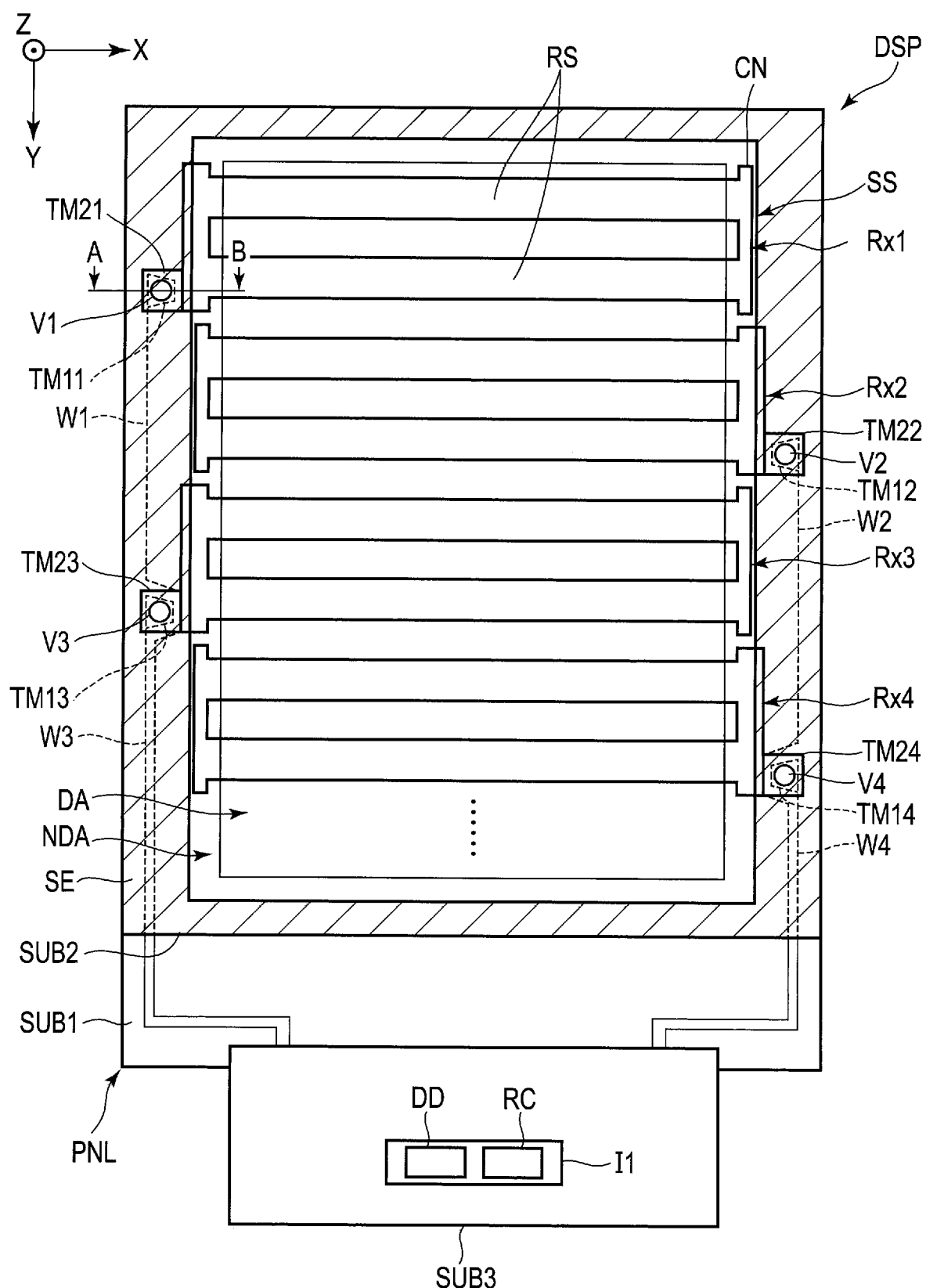
FIG. 11 is a plan view showing a configuration example of the display device of the embodiment.

FIG. 11 is a plan view showing a configuration example of the display device DSP of this embodiment. Here, a plane of the display device DSP taken along the X-Y plane defined by the first direction X and the second direction Y is shown.

The display device DSP comprises a display panel PNL, an IC chip I1, a wiring substrate SUB3 and the like. The display panel PNL is a liquid crystal display panel, and comprises a first substrate SUB1, a second substrate SUB2, a sealing material SE and a display function layer equivalent to a liquid crystal layer. The second substrate SUB2 opposes the first substrate SUB1. The sealing material SE corresponds to a portion hatched by lines upwardly slanting to the right in FIG. 1 and attaches the first substrate SUB1 and the second substrate SUB2 together.

The display panel PNL comprises a display area DA which displays images and a frame-shaped non-display area NDA surrounding the display area DA. The sealing material SE is located in the non-display area NDA and the display area DA is located in an inner side encircled by the sealing material SE.

The wiring substrate SUB3 is mounted on the first substrate SUB1. The IC chip I1 is mounted on the wiring substrate SUB3. Note that this configuration is not limited to the example illustrated, but the IC chip I1 may be mounted on the portion of the first substrate SUB1, which extends out from the second substrate SUB2, or on an external circuit board connected to the wiring substrate SUB3. The IC chip I1 includes, for example, a built-in display driver DD which outputs a signal required to display images. The display driver DD described here contains at least a part of signal line drive circuits SD, scanning line drive circuits GD and common electrode drive circuits CD, which will be described later. In the example illustrated, the IC chip I1 contains a built-in detector RC which functions as a touch-panel controller or the like. The detector RC may be built in an IC chip other than the IC chip I1.

The display panel PNL may be, for example, any one of a transmissive type which displays images by selectively transmitting light from below the first substrate SUB1, a reflective type which displays images by selectively reflecting light from above the second substrate SUB2 and a trans-reflective type comprising a transmissive display function and a reflective display function.

A sensor SS carries out sensing to detect contact or approaching of an object with respect to the display device DSP. The sensor SS comprises a plurality of detection electrodes Rx (Rx1, Rx2, . . . ). The detection electrodes Rx are formed in the second substrate SUB2. These detection electrodes Rx each extend along the first direction X and arranged along the second direction Y to be spaced from each other.

FIG. 11 shows the detection electrodes Rx1 to Rx4 as the detection electrode Rx, and here its structure example will be described while focusing on the detection electrode Rx1. In FIG. 11, one end side is defined as the region on the left-hand side to the display area DA, and the other end side as the region on the right-hand side to the display area DA.

The detection electrode Rx1 comprises a detector RS and a connector CN. The detector RS is located in the display area DA and extends in the first direction X. In the detection electrode Rx1, the detector RS is mainly used for sensing. In the example illustrated, the detector RS is formed into a stripe shape, but more specifically, it is formed from an aggregate of fine metal thin wires as will be illustrated with reference to FIG. 15. Further, one detection electrode Rx comprises two detectors RS, but may comprise three or more detectors RS, or may comprise only one detector RS. The terminal RT is located on the other end side of the non-display area NDA along the first direction X and connects a plurality of detectors RS to each other.

The detection electrode Rx1 is connected to the second terminal TM2. The second terminal TM2 is formed in a position overlapping the sealing material SE in plan view. The second terminal TM2 is located on one end side of the non-display area NDA along the first direction X and is connected to the detector RS.

On the other hand, the first substrate SUB1 comprises a first terminal TM1 and a wiring line W1, electrically connected to the wiring substrate SUB3. The first terminal TM1 and the wiring line W1 are located in the one end side of the non-display area NDA and overlap the sealing material SE in plan view. The first terminal TM1 is formed in a position which overlaps the second terminal TM2 in plan view. The wiring line W1 is connected to the first terminal TM1, extending along the second direction Y, and is electrically connected to the detector RC of the IC chip I1 via the wiring substrate SUB3.

The contact hole V1 is formed in a position where the second terminal TM2 and the first terminal TM1 oppose each other. The contact hole V1 penetrates the second substrate SUB2 including the second terminal TM21 and the sealing material SE. Further, the contact hole V1 may penetrate the first terminal TM11. As will be described later, the connecting material C with conductivity is formed in the contact hole V1. Thus, the second terminal TM21 and the first terminal TM11 are electrically connected to each other. That is, the detection electrode Rx1 provided in the second substrate SUB2 is electrically connected to the detector RC via the wiring board SUB3 connected to the first substrate SUB1. The detector RC reads a sensor signal output from the detection electrode Rx, and detects whether or not a detection object touches or approaches and the position coordinates of the detection object, etc.

In the example illustrated, the contact hole V1 is circular in planar view, but the shape thereof is not limited to that of the example illustrated, but may be some other shape such as elliptical.

In the example illustrated, the second terminal TM21, TM23, . . . , first terminals TM11, TM13, . . . , wiring lines W1, W3, . . . and contact holes V1, V3, . . . , connected to odd-numbered detection electrodes Rx1, Rx3, . . . , are each located in the one end side of the non-display area NDA. Moreover, second terminal TM22, TM24, . . . , first terminals TM12, TM14, . . . , wiring lines W2, W4, . . . , and contact holes V2, V4, . . . , connected to even-numbered detection electrodes Rx2, Rx4, . . . , are each located in the other end side of the non-display area NDA. With such a layout, the one end side and the other end side of the non-display area NDA can be equalized in width, which is effective for the reduction of the width of the frame. Further, the wiring line W1 is connected to the detection electrode Rx via the first terminal TM1, and therefore when the wiring line W1 connected to the detection electrode Rx is formed on a first substrate SUB1 side, the region for forming the wiring line W1 in the second substrate SUB2 is no longer necessary. Consequently, the region for arranging other members can be expanded, and further the degree of freedom in the layout of the shape of the second substrate SUB2 can be improved.

As illustrated, in the layout in which the first terminal TM13 is closer to the wiring board SUB3 than to the first terminal TM11, the wiring line W1 detour around an inner side (side close to the display area DA) of the first terminal TM13 and is arranged along an inner side of the wiring line W3 between the first terminal TM13 and the wiring board SUB3. Similarly, the wiring line W2 detour around an inner side of the first terminal TM14, and is arranged along an inner side of the wiring line W4 between the first terminal TM14 and the wiring board SUB3.

Figure 12:
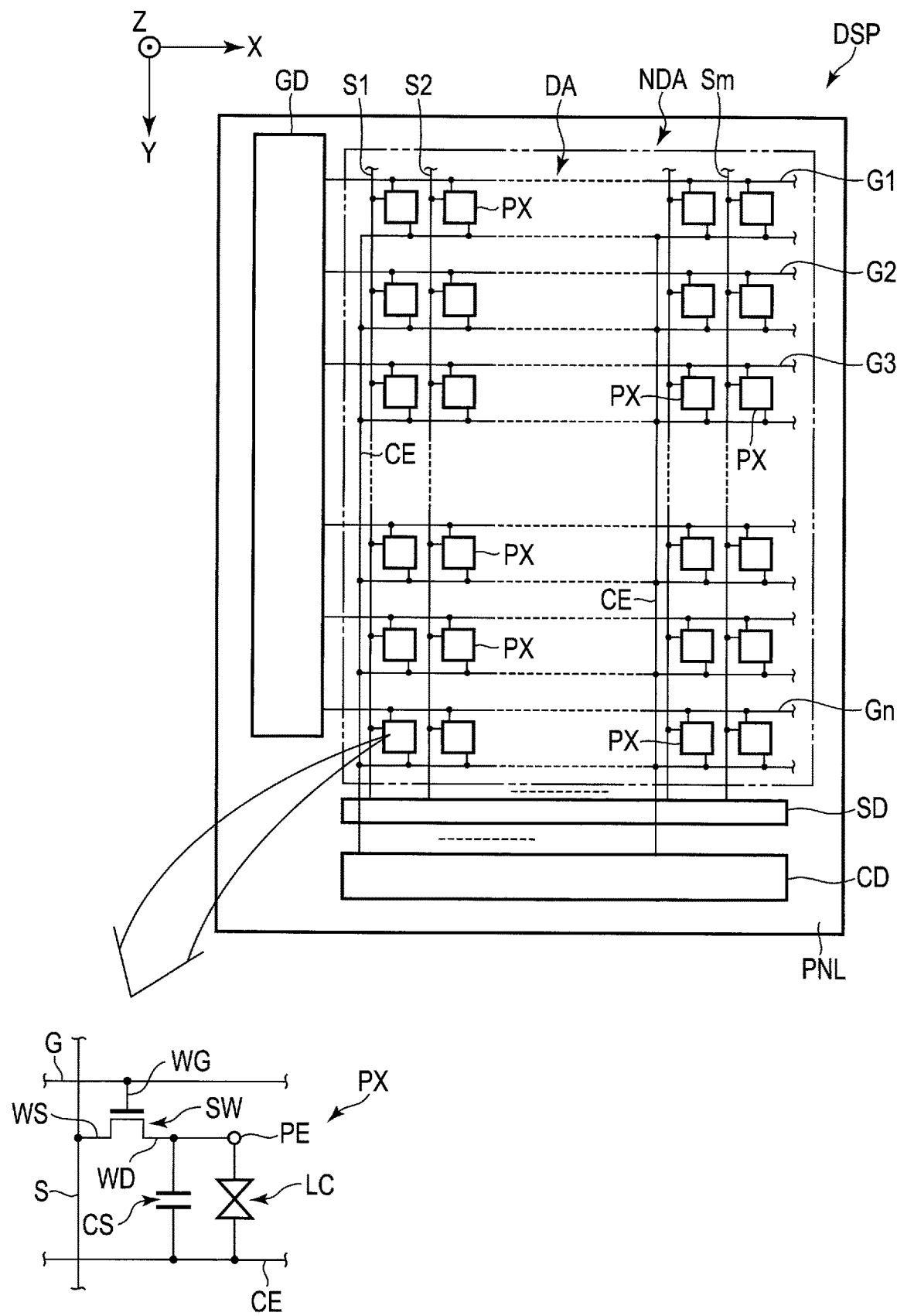
FIG. 12 is a diagram showing a basic structure and an equivalent circuit of a display panel shown in FIG. 11.

FIG. 12 is a diagram showing a basic structure and an equivalent circuit of the display panel PNL shown in FIG. 11.

The display panel PNL comprises a plurality of pixels PX in the display area DA. Here, each pixel indicates a minimum unit individually controllable according to a pixel signal, and exists in the region containing a switching element provided at a position where a scanning line and a signal line cross each other, for example, which will be described later. The pixels PX are arranged in a matrix along the first direction X and the second direction Y. Further, the display panel PNL comprises a plurality of scanning lines G (G1 to Gn), a plurality of signal lines S (S1 to Sm), common electrodes CE, etc., in the display area DA. The scanning lines G each extend along the first direction X and are arranged along the second direction Y. The signal lines S each extend along the second direction Y and are arranged along the first direction X. The scanning lines G and the signal lines S are not necessarily formed to extend linearly, but may be partially bent. The common electrodes CE are each provided for a plurality of pixels PX. The scanning lines G, the signal lines S and the common electrodes CE are all drawn out to the non-display area NDA. In the non-display area NDA, the scanning lines G are connected to the scanning line drive circuit GD, the signal lines S are connected to the signal line drive circuit SD, and the common electrodes CE are connected to the common electrode drive circuit CD. The signal line drive circuit SD, the scanning line drive circuit GD and the common electrode drive circuit CD may be formed on the first substrate SUB1 or partially or entirely built in the IC chip I1 shown in FIG. 11.

Each pixel PX comprises a switching element SW, a pixel electrode PE, a common electrode CE, a liquid crystal layer LC, etc. The switching element SW is, for example, a thin film transistor (TFT) and is electrically connected to a respective scanning line G and a respective signal line S. More specifically, the switching element PSW comprises a gate electrode WG, a source electrode WS and a drain electrode WD. The gate electrode WG is electrically connected to the scanning line G. In the example illustrated, the electrode electrically connected to the signal line S is referred to as the source electrode WS, and the electrode electrically connected to the pixel electrode PE is referred to as the drain electrode WD.

The scanning line G is connected to the switching element PSW in each of those pixels PX which are arranged along the first direction X. The signal line S is connected to the switching element PSW in each of those pixels PX arranged along the second direction Y. Each of the pixel electrodes PE opposes the respective common electrode CE and drives the liquid crystal layer LC with an electric field produced between the pixel electrode PE and the common electrode CE. A storage capacitor CS is formed, for example, between the common electrode CE and the pixel electrode PE.

Figure 13:
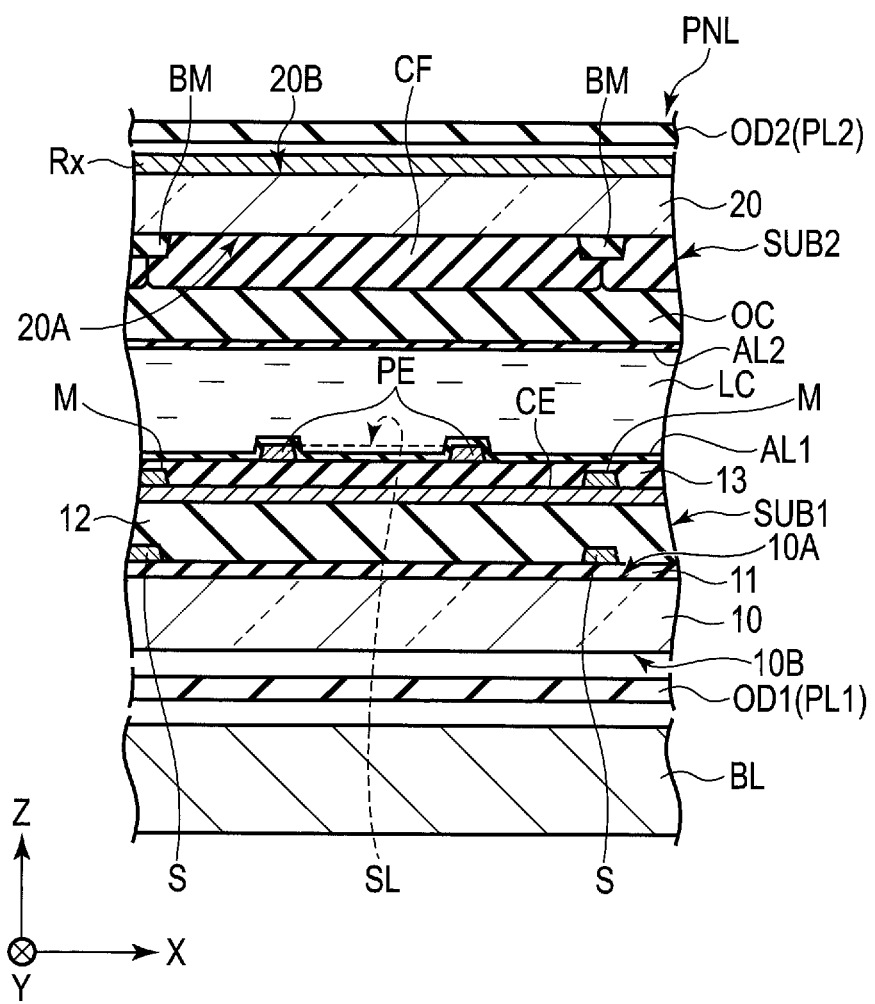
FIG. 13 is a cross-sectional view showing the structure of a part of the display panel shown in FIG. 11.

FIG. 13 is a cross section showing a part of structures of the display panel PNL shown in FIG. 11.

The display panel PNL illustrated here has a structure provided for the display mode which mainly uses a lateral electric field substantially parallel to a surface of the substrate. The display panel PNL may have a structure provided for display mode using a vertical electric field perpendicular to the surface of the substrate, or an electric field oblique to the surface, or a combination thereof. To the display mode using a lateral electric field, for example, such a structure is applicable, that both of the pixel electrode PE and the common electrode CE are provided one of the first substrate SUB1 and the second substrate SUB2. To the display mode using a vertical electric field or an oblique electric field, for example, such a structure is applicable, that one of the pixel electrode PE and the common electrode CE is provided on the first substrate SUB1, and the other one of the pixel electrode PE and the common electrode CE is provided on the second substrate SUB2. Note that the surface of the substrate here is that parallel to the X-Y plane.

The first substrate SUB1 comprises a first base member 10, signal lines S, a common electrode CE, metal layers M, a pixel electrode PE, a first insulating layer 11, a second insulating layer 12, a third insulating layer 13, a first alignment film AL1, etc. Note that the illustration of the switching element, scanning lines and various insulating layers interposed between these, etc., is omitted.

The first insulating layer 11 is located on the surface 10A of the first base member 10. The signal lines S are located on the first insulating layer 11. The second insulating layer 12 is located on the signal lines S and the first insulating layer 11. The common electrode CE is located on the second insulating layer 12. The metal layers M are in contact with the common electrode CE at positions directly above the signal lines S, respectively. In the example illustrated, the metal layers M are located on the common electrode CE, but may be located between the common electrode CE and the second insulating layer 12. The third insulating layer 13 is located on the common electrode CE and the metal layers M. The pixel electrode PE is located on the third insulating layer 13. The pixel electrode PE opposes the common electrode CE via the third insulating layer 13. The pixel electrode PE comprises a slit SL in a position opposing the common electrode CE. The first alignment film AL1 covers the pixel electrode PE and the third insulating layer 13.

The structure of the first substrate SUB1 is not limited to the example illustrated, but the pixel electrode PE may be located between the second insulating layer 12 and the third insulating layer 13 and the common electrode CE may be located between the third insulating layer 13 and the first alignment film AL1. In such a case, the pixel electrode PE is formed into a plate shape without a slit, and the common electrode CE is formed to comprise a slit which opposes the pixel electrodes PE. Alternatively, both of the pixel electrode PE and the common electrode CE may be each formed into a comb teeth shape and arranged to engage with each other in gear.

The second substrate SUB2 comprises a second base member 20, light-shielding layers BM, color filters CF, an overcoat layer OC, a second alignment film AL2, etc.

The light-shielding layers BM and the color filters CF are located in the surface 20A of the second base member 20. The light-shielding layers BM partition the pixels from each other and are located directly above the signal lines S, respectively. The color filters CF oppose the pixel electrodes PE and partially overlap the respective light-shielding layers BM. The color filter CF includes a red color filter, a green color filter, a blue color filter and the like. The overcoat layer OC covers the color filter CF. The second alignment film AL2 covers the overcoat layer OC.

The color filter CF may be disposed on the first substrate SUB1. The color filter CF may include color filters of four or more colors. On a pixel to display a white color, a white color filter or an uncolored resin material may be disposed or the overcoat layer OC may be disposed without disposing the color filter.

The detection electrode Rx is located on the surface 20B of the second base member 20. The detection electrodes Rx may be formed from a conductive layer containing a metal or a transparent conductive material such as ITO or IZO, or formed by depositing a transparent conductive layer on a conductive layer containing a metal, or formed of a conductive organic material or a dispersing element of a fine conductive material or the like.

A first optical element OD1 including a first polarizer PL1 is located between the first base member 10 and an illumination device BL. A second optical element OD2 including a second polarizer PL2 is located on the detection electrodes Rx. Each of the first optical element OD1 and the second optical element OD2 may include a retardation film as needed.

The scanning lines, the signal lines S and the metal layers M are each formed from a metal material such as molybdenum, tungsten, titanium or aluminum and may be formed in a single- or multi-layer structure. For example, the scanning lines are formed of a metal material containing molybdenum and tungsten, the signal lines S are formed of a metal material containing titanium and aluminum, and the metal layer M is formed of a metal material containing molybdenum and aluminum. The common electrodes CE and the pixel electrodes PE are each formed of a transparent conductive material such as ITO or IZO. The first insulating layer 11 and the third insulating layer 13 are inorganic insulating layers while the second insulating layer 12 is an organic insulating layer.

Next, a configuration example of the sensor SS built in the display device DSP of this embodiment will be explained. The sensor SS explained below is, for example, a capacitive sensor of a mutual-capacitive type, which detects contact or approach of an object, based on the variation in electrostatic capacitance between a pair of electrodes opposing via a dielectric.

FIG. 14 is a plan view showing a configuration example of the sensor SS.

In the configuration example illustrated, the sensor SS comprises sensor drive electrodes Tx and detection electrodes Rx. In the example illustrated, the sensor drive electrodes Tx correspond to portions hatched by lines downwardly slanting to the right and are provided on the first substrate SUB1. The detection electrodes Rx correspond to portions hatched by lines upwardly slanting to the right and are provided on the second substrate SUB2. The drive electrodes Tx and the detection electrodes Rx cross each other in the X-Y plane. The detection electrodes Rx oppose the sensor drive electrodes Tx along the third direction Z.

The sensor drive electrodes Tx and the detection electrodes Rx are located in the display area DA and some of the electrodes extend out to the non-display area NDA. In the example illustrated, the drive electrodes Tx are each formed into a strip shape extending along the second direction Y and arranged along the first direction X to be spaced from each other. The detection electrodes Rx each extend along the first direction X and are arranged along the second direction Y to be spaced from each other. As explained with reference to FIG. 11, the detection electrodes Rx are connected to the first terminal provided on the first substrate SUB1 and electrically connected to the detection circuit RC via the wiring lines. Each of the sensor drive electrodes Tx is electrically connected to the common electrode drive circuit CD via a wiring line WR. The number, size and shape of the sensor drive electrodes Tx and the detection electrodes Rx are not particularly limited but can be variously changed.

The sensor drive electrodes Tx each function also as the above-described common electrode CE. In other words, they have a function of generating an electric field between themselves and the respective pixel electrode PE, and also a function of detecting the position of the object by generating the capacitance between themselves and the respective detection electrode Rx.

The common electrode driving circuit CD supplies common drive signals to the drive electrodes Tx including the common electrode CE at the display driving time to display images on the display area DA. Further, the common electrode drive circuit CD supplies sensor drive signals to the sensor drive electrodes Tx at the sensing driving time to execute sensing. The detection electrodes Rx generate electrostatic capacitance between the sensor drive electrodes Tx and themselves in accordance with supply of the sensor drive signals to the sensor drive electrodes Tx. The electrostatic capacitance varies as an object to be detected such as a finger approaches. From the detection electrodes Rx, the detection signals based on the electrostatic capacitance are output. The detection signals output from the detection electrodes Rx are input to the detection circuit RC shown in FIG. 11.

The sensor SS in each of the above-explained configuration examples is not limited to the sensor of the mutual-capacitive type which detects objects based the variation in electrostatic capacitance between a pair of electrodes (in the above case, the electrostatic capacitance between the sensor drive electrodes Tx and the detection electrodes Rx), but may be a self-capacitive type which detects objects based on the variation in electrostatic capacitance between the detection electrodes Rx.

In the example illustrated, the sensor drive electrodes Tx each extend along the second direction Y and arranged along the first direction X with a gap between each adjacent pair, but the sensor drive electrodes Tx may each extend along the first direction X and arranged along the second direction Y with a gap between each adjacent pair. In this case, the detection electrodes Rx each extend along the second direction Y and are arranged along the first direction X with a gap between each adjacent pair.

Figure 15:
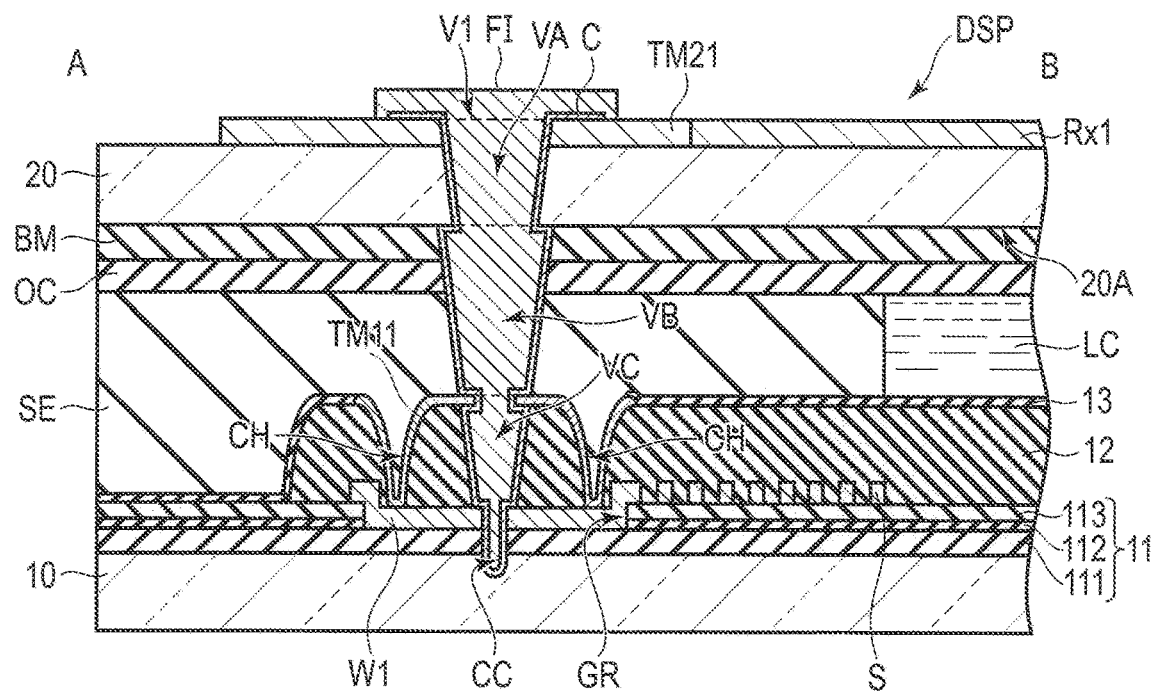
FIG. 15 is a cross section of the display panel taken along a line A-B shown in FIG. 11, which includes a contact hole.
Figure 16:
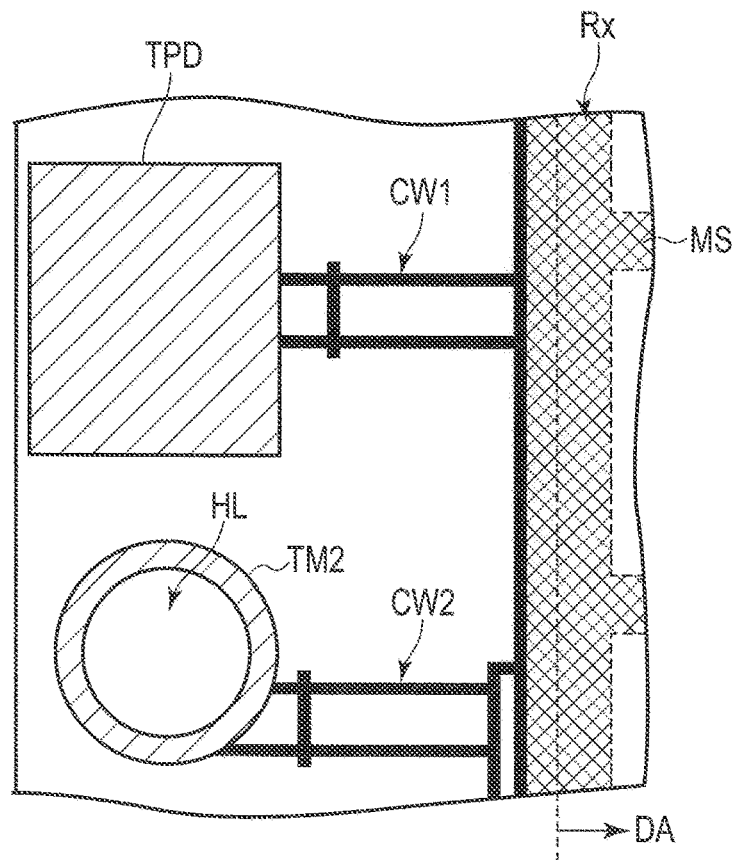
FIG. 16 is a diagram showing a processing step in an example of a method of manufacturing a display device of the embodiment.

FIG. 15 is a cross section of the display panel taken along a line A-B shown in FIG. 11, which includes a contact hole V1. Here, only main parts necessary for the explanation are shown, and the first and second alignment films and the like are omitted from the illustration. Further, the structure shown in FIG. 16 is a specific example of that shown in FIG. 1, and explanation of the members overlapping those of FIG. 1 will be omitted.

The first insulating layer 11 comprises an insulating layer 111, an insulating layer 112 and an insulating layer 113. The insulating layer 111, the insulating layer 112, and the insulating layer 113 are stacked in this order on the first base member 10. The first insulating layer 11 comprises a concavity GR. In the example illustrated, the concavity GR penetrates the insulating layers 112 and 113 to the insulating layer 111. Although will not be explained in detail, the semiconductor layer of the switching element is disposed between the insulating layer 111 and the insulating layer 112 in the display area, and the scanning lines G shown in FIG. 12 are disposed between the insulating layer 112 and the insulating layer 113.

In the example illustrated, the wiring line W1 is disposed inside the concavity GR. That is, the wiring line W1 is in contact with the insulating film 111. The signal line S is located on the first insulating layer 11. Here, the wiring line W1 may be disposed on the insulating film 113, for example, is located in the same layer as that of the signal line S. The wiring line W1 is formed together with, for example, the signal line S at once from the same material. The second insulating film 12 covers the wiring line W1 and the signal line S, and is arranged also on the insulating film 113. The first terminal TM11 is located between the second insulating film 12 and the sealing material SE. The first terminal TM11 is electrically connected with the wiring line W1 via a contact hole CH which penetrates the second insulating film 12 to the wiring line W1. In this embodiment, the first terminal TM1 is formed together with the common electrode CE or the pixel electrode PE shown in FIG. 13 at once from the same material. Or the first terminal TM1 may be formed by stacking a layer formed together with the common electrode CE at once from the same material and a layer formed together with the pixel electrode PE at once from the same material. The third insulating film 13 is disposed on the second insulating film 12.

Note that in the position which overlaps the concavity GR, the insulating film 111 may penetrate even to the first base member 10, and the wiring line W1 disposed inside the concavity GR may be in contact with the first base member 10.

The light-shielding layer BM is located in the surface 20A. The overcoat layer OC covers the light-shielding layer BM. The sealing material SE is located between the first substrate SUB1 and the second substrate SUB2. The liquid crystal layer LC is located in the region surrounded by the first substrate SUB1, the second substrate SUB2 and the sealing material SE.

Although will not be illustrated, the first alignment film may be provided on a sealing material SE side of the first substrate SUB1. Further, the second alignment film may be provided on a sealing material SE side of the second substrate SUB2.

Here, the hole VA penetrates the second terminal TM21 and the second base member 20. The hole VB penetrates the light-shielding layer BM, the overcoat layer OC and the sealing material SE. The hole VC penetrates the first terminal TM11, the second insulating film 12, the wiring line W1 and the first insulating film 11. Further, the first base member 10 comprises a concavity CC. The connecting material C is provided on the inner surface of each of the through-holes VA, VB, VC and the concavity CC.

A hollow section of the contact hole V1 is filled with the filling material FI. Further, the filling material FI is disposed also on the second terminal TM2.

In the example illustrated, the first terminal TM11 projects out in the contact hole V1. With this structure, the contact area between the first terminal TM11 and the connecting material C can be increased in the contact hole V1. Thus, it is possible to improve the reliability of the conduction between the connecting material C and the wiring line W1 via the first terminal TM11.

Next, an example of the method of manufacturing the display device DSP described above will be described with reference to FIGS. 16 to 20.

FIGS. 16 to 20 are diagrams showing the method of manufacturing the display device DSP of the embodiment.

First, as shown in FIGS. 16 and 17, the display panel PNL is prepared. FIG. 16 is a plan view showing an example of the detection electrode Rx and the second terminal TM2. In the example shown in FIG. 16, the detection electrode Rx is formed from meshed metal thin wires MS. An inspection pad TPD is connected to the detection electrode Rx via a connection wiring line CW1. The second terminal TM2 is formed by stacking a metal layer and an oxide layer one on another as shown in FIG. 2. Here, the metal layer is formed from, for example, the same material as that of the detection electrode Rx. Further, the second terminal TM2 may be entirely an oxide electrode as shown in FIG. 4. The second terminal TM2 comprises a circular hole HL formed therein.

Note that the shape of the detection electrode Rx is not limited to that illustrated in the example, but may be, for example, wavy, or some other shape such as sawtooth or sine wave.

FIG. 17 shows a cross section of the display panel PNL shown in FIG. 16. In the display panel PNL illustrated, the first substrate SUB1 comprises a first terminal TM1 disposed on the surface 10A side, and the second substrate SUB2 comprises a second terminal TM2 arranged on the surface 20B side. The first terminal TM1 comprises a first oxide electrode OX1 and a second oxide electrode OX2 as in the example shown in FIG. 6. The second terminal TM2 comprises a metal layer MT and an oxide electrode OX as in the example shown in FIG. 2. Further, the second terminal TM2 comprises a hole HL. The protection material PT covers the second terminal TM2, and is brought into contact with the surface 20B in the hole HL.

Figure 18:
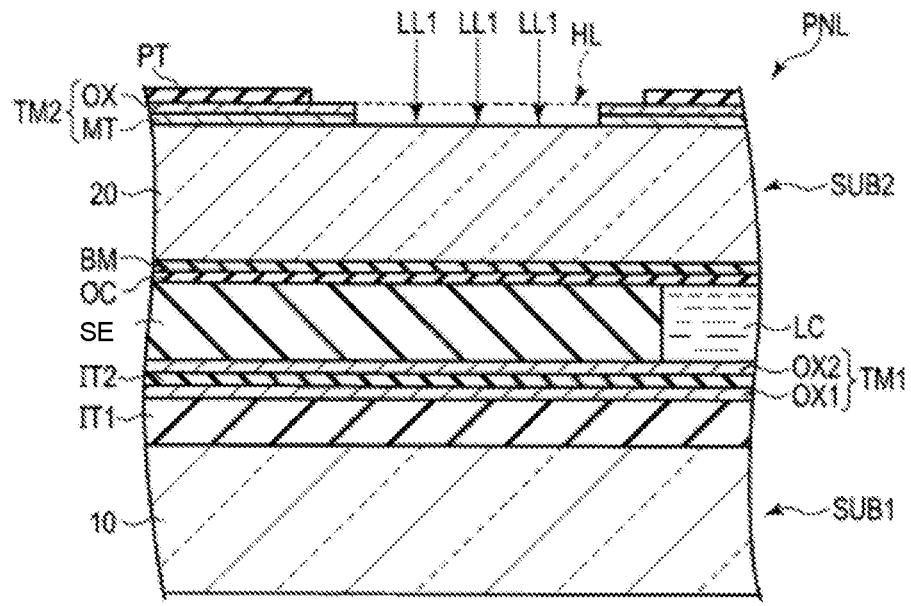
FIG. 18 is a diagram showing a processing step in the example of the method of manufacturing the display device of the embodiment.

Subsequently, as shown in FIG. 18, laser beam LL1 is irradiated from above the second substrate SUB2. With the irradiation of the laser beam LL1, the protection material PT in the hole HL is removed. At the same time, the portion of the protection material PT which is located on the second terminal TM2 around the hole HL is also removed. That is, a part of the upper surface of the second terminal TM2 is exposed.

Figure 19:
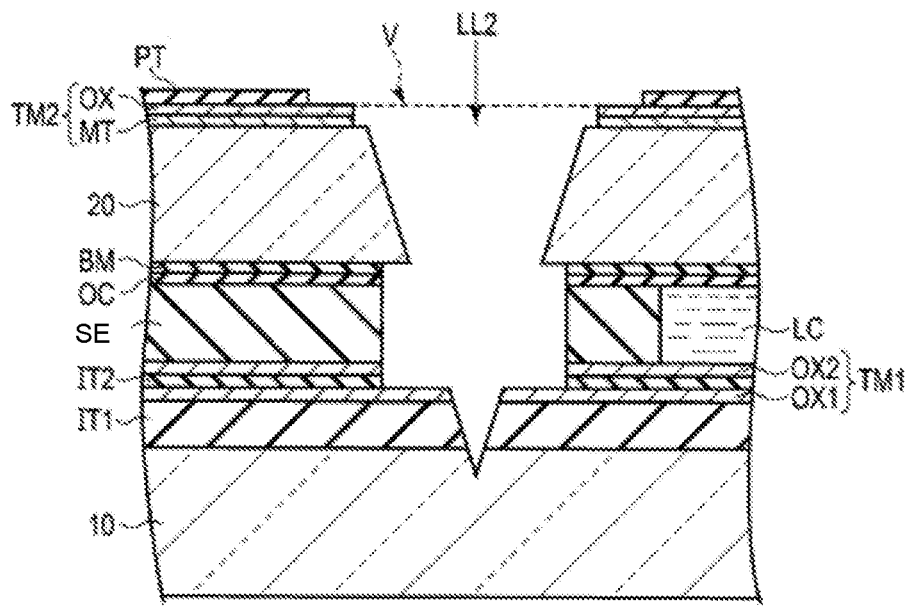
FIG. 19 is a diagram showing a processing step in the example of the method of manufacturing the display device of the embodiment.

Then, as shown in FIG. 19, laser beam LL2 is irradiated from above the second substrate SUB2. As the laser beam source, for example, a carbon dioxide gas laser is applicable, but various devices, as long as being able to drill a hole in a glass material or organic material, may be used as well, including an excimer laser device. With the irradiation of the laser beam LL2 in such a manner, the contact hole V for connecting the first terminal TM1 and the second terminal TM2 is formed.

Note that in the step shown in FIG. 19, a part of the upper surface of the second terminal TM2 is exposed, but the second terminal TM2 includes the oxide electrode OX as its top layer, and therefore, it cannot be oxidized easily. Thus, it is possible to suppress the increase in the resistance of the second terminal TM2.

Figure 20:
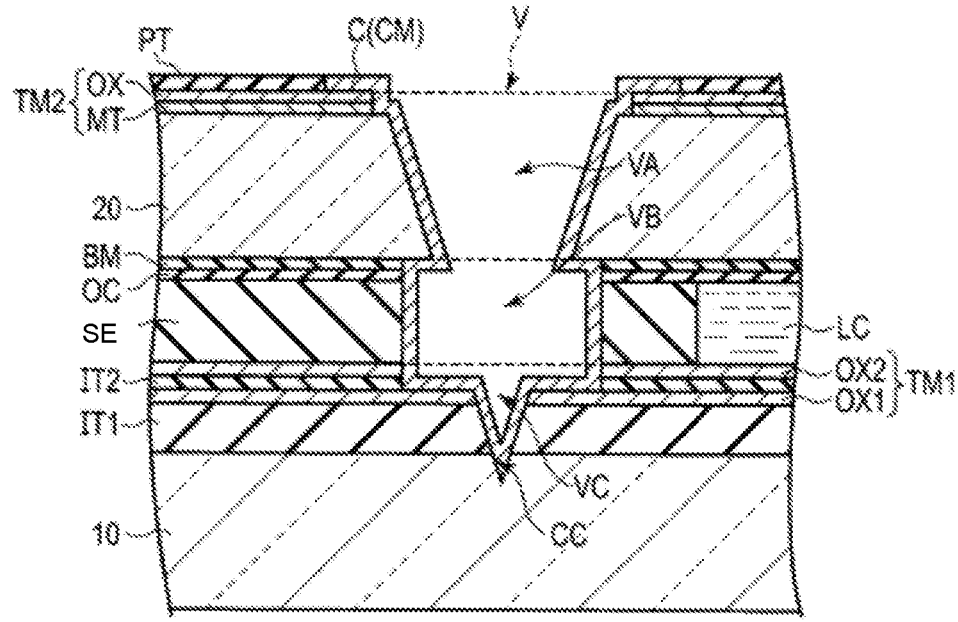
FIG. 20 is a diagram showing a processing step in the example of the method of manufacturing the display device of the embodiment.

Next, as shown in FIG. 20, the connecting material C which electrically connects the first terminal TM1 and the second terminal TM2 to each other is formed. More specifically, first, the display panel PNL is placed in a chamber, and the air in the chamber is discharged. Then, a conductive material CM is injected to the contact hole V in a vacuum (under an environment of pressure lower than atmospheric pressure). Thereafter, a gas such as air or inert gas is introduced to the chamber to lower the degree of vacuum, which causes the conductive material CM to flow into the holes VB, VC and the concavity CC from the hole VA and to be brought into contact with the first terminal TM1. Then, as the solvent contained in the conductive material CM evaporates, the volume of the conductive material CM decreases. As a result, fine particles of the metal material in the conductive material CM remain as a coat on the inner surface of the contact hole V, and a hollow portion is formed in the contact hole V. The connecting material C is brought into contact with each of the second terminal TM2 and the second base member 20 in the hole VA. Further, it is also brought into contact with each of the light-shielding layer BM, the overcoat layer OC and the sealing material SE in the hole VB, with each of the first terminal TM1, the first interlayer insulating film IT1 and the second interlayer insulating film IT2 in the hole VC, and also with the first base member 10 in the concavity CC.

Note that the method of forming the connecting material C described with reference to FIG. 20 is only an example and is not limited to this. For example, the connecting material C similar to that described above can be formed by such a technique that the connecting material C is injected to the hole VA under atmospheric pressure, and then the solvent contained in the connecting material C is removed.

Next, another example of the method of manufacturing the display device DSP described above will be described with reference to FIGS. 21 to 23.

Figure 21:
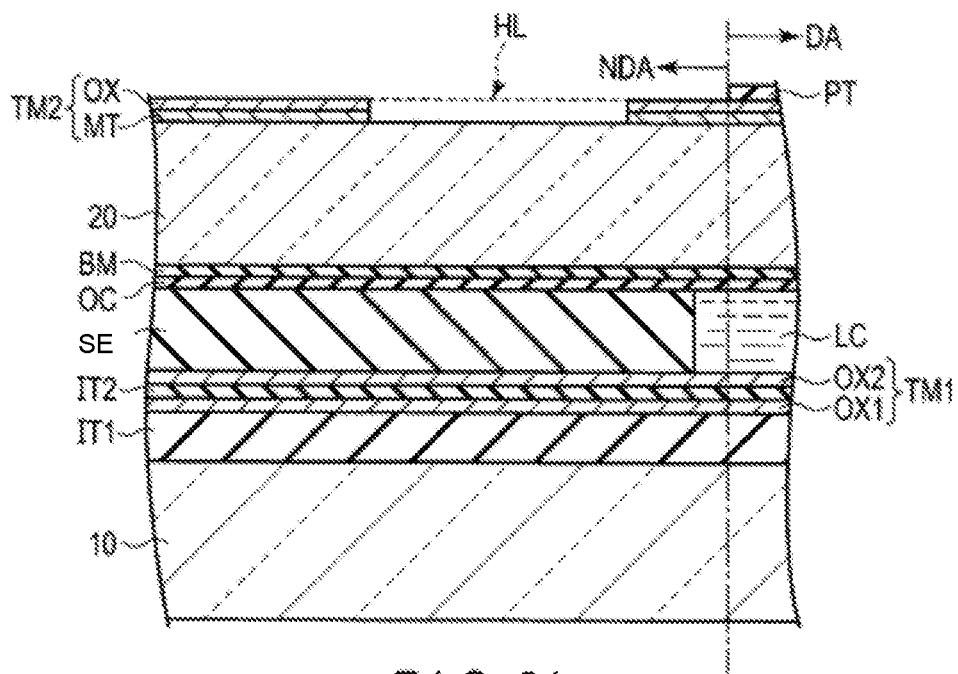
FIG. 21 is a diagram showing a processing step in another example of the method of manufacturing the display device of the embodiment.
Figure 22:
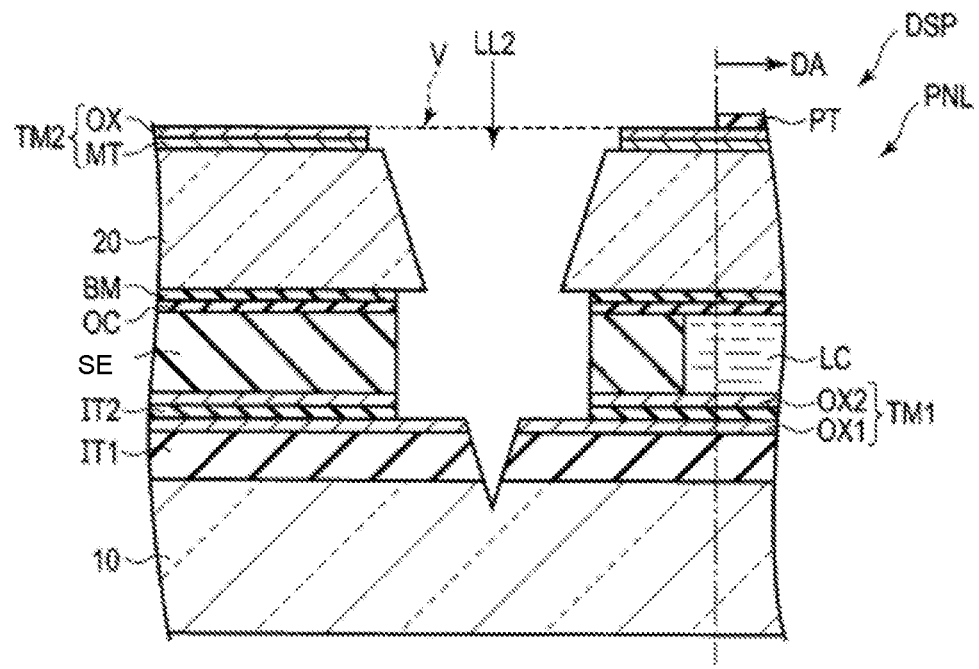
FIG. 22 is a diagram showing a processing step in the example of the method of manufacturing the display device of the embodiment.
Figure 23:
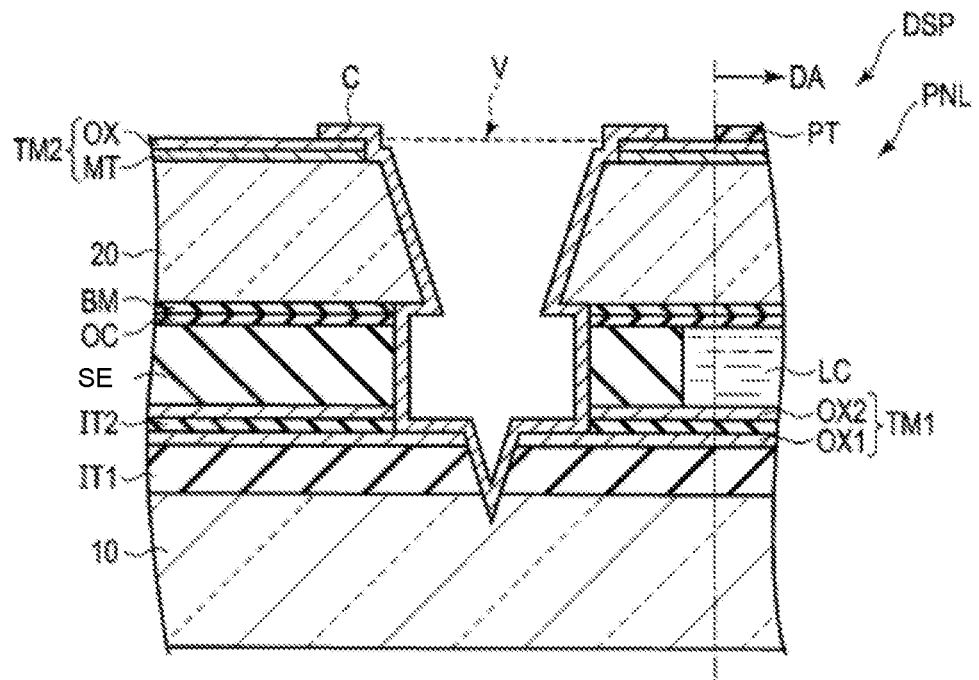
FIG. 23 is a diagram showing a processing step in the example of the method of manufacturing the display device of the embodiment.

FIGS. 21 to 23 are diagrams showing another example of the above-described method of manufacturing the display device DSP of the embodiment.

First, as shown in FIG. 21, the display panel PNL is prepared. The structure shown in FIG. 21 is different from that FIG. 17 in that the protection material PT is not formed in the non-display area NDA.

Subsequently, as shown in FIG. 22, laser beam LL2 is irradiated from above the second substrate SUB2, and thus the contact hole V is formed.

Then, as shown in FIG. 23, the connecting material C is formed. Here, the connecting material C is formed in a similar manner to that of the manufacturing method shown in FIG. 20.

Note that in the steps shown in FIGS. 21 to 23, the upper surface of the second terminal TM2 is exposed in the non-display area NDA, but the second terminal TM2 includes the oxide electrode OX as its top layer, and therefore, it cannot be oxidized easily. Thus, it is possible to suppress the increase in the resistance of the second terminal TM2.

Further, in the steps shown in FIGS. 21 to 23, the protection material PT is not disposed on the non-display area NDA, the step of removing the protection material PT by laser beam, as shown in FIG. 18 can be omitted.

FIG. 24 is a plan view showing another configuration example of the display device DSP of this embodiment. The structure shown in FIG. 24 is different from that FIG. 11 in that the detection electrodes Rx1, Rx2, Rx3, . . . , each extend along the second direction Y and are arranged along the first direction X with a gap between each adjacent pair.

In the example illustrated, the detector RS extends in the second direction Y in the display area DA. The second terminals TM21, TM22, TM23, . . . , are arranged along the first direction X with a gap between each adjacent pair between the display area DA and the wiring board SUB3. The contact holes V1, V2, V3, . . . , are arranged along the first direction X with a gap between each adjacent pair. Although not illustrated, the display device DSP may comprise sensor drive electrodes extending in the first direction X and arranged along the second direction Y with a gap between each adjacent pair.

The configuration example shown in FIG. 24 is applicable to a self-capacitive type sensor SS which utilizes the detection electrodes Rx, and also applicable to mutual-capacitive type sensor SS which utilizes the sensor drive electrode (not illustrated) and the detection electrodes Rx.

As described above, according to this embodiment, a display device with a frame whose width is reducible can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate comprising a first base member and a first terminal;
a second substrate comprising a second base member comprising a first surface opposing and spaced apart from the first terminal and a second surface on an opposite side to the first surface, a second terminal located on a side of the second surface, and a first hole which penetrates from the first surface to the second surface and the second terminal;
a liquid crystal layer disposed between the first substrate and the second substrate;
an organic insulating layer located between the first terminal and the second base member and comprising a second hole connecting to the first hole; and
a connecting material provided on the first hole to electrically connect the first terminal and the second terminal to each other, wherein
the organic insulating layer includes a sealant which attaches the first substrate and the second substrate and surrounds the liquid crystal layer,
a diameter of the second hole is greater than a diameter of the first hole, and
at least one of the first terminal and the second terminal including an oxide electrode in contact with the connecting material.

2. The device of claim 1, wherein the second terminal is an oxide electrode in contact with the second surface.

3. The device of claim 2, further comprising: a detection electrode located on the second surface and connected to the second terminal, wherein a thickness of the second terminal is greater than a thickness of the detection electrode.

4. The device of claim 1, wherein the second terminal comprises a metal layer in contact with the second surface and an oxide electrode in contact with the metal layer.

5. The device of claim 1, further comprising: a protection material covering the second terminal.

6. The device of claim 1, further comprising: a first interlayer insulating layer located between the first base member and the first terminal,
wherein the first terminal comprises a first oxide electrode located on the first interlayer insulating layer.

7. The device of claim 6, wherein the first terminal comprises a second oxide electrode above the first oxide electrode.

8. The device of claim 7, further comprising: a second interlayer insulating layer between the first oxide electrode and the second oxide electrode.

9. The device of claim 7, wherein the second oxide electrode is in contact with the first oxide electrode.

10. The device of claim 7, further comprising: a metal wiring line on the first interlayer insulating layer so as to be connected to the first oxide electrode.

11. The device of claim 1, wherein
the first substrate comprising a third hole which penetrates the first terminal.

12. A display device comprising:
a first substrate comprising a first base member, a first terminal and a first interlayer insulating layer located between the first base member and the first terminal;
a second substrate comprising a second base member comprising a first surface opposing and spaced apart from the first terminal and a second surface on an opposite side to the first surface, a second terminal located on a side of the second surface, and a first hole which penetrates from the first surface to the second surface and the second terminal;
a liquid crystal layer disposed between the first substrate and the second substrate;
an organic insulating layer located between the first terminal and the second base member and comprising a second hole connecting to the first hole; and
a connecting material provided on the first hole to electrically connect the first terminal and the second terminal to each other, wherein
the organic insulating layer includes a sealant which attaches the first substrate and the second substrate and surrounds the liquid crystal layer,
a diameter of the second hole is greater than a diameter of the first hole, and
the first terminal comprising a first oxide electrode located on the first interlayer insulating layer, a second oxide electrode located above the first oxide electrode, and a second interlayer insulating layer located between the first oxide electrode and the second oxide electrode,
the second terminal comprising a metal layer in contact with the second surface and a third oxide electrode in contact with the metal layer, and
the first oxide electrode, the second oxide electrode, and the third oxide electrode are in contact with the connecting material.

13. The device of claim 12, wherein
the first substrate comprising a third hole which penetrates the first terminal.

14. An inter-substrate conducting structure comprising:
a first substrate comprising a first base member and a first terminal;
a second substrate comprising a second base member comprising a first surface opposing and spaced apart from the first terminal and a second surface on an opposite side to the first surface, a second terminal located on a side of the second surface, and a first hole which penetrates from the first surface to the second surface and the second terminal;
a liquid crystal layer disposed between the first substrate and the second substrate;
an organic insulating layer located between the first terminal and the second base member and comprising a second hole connecting to the first hole; and a connecting material provided on the first hole to electrically connect the first terminal and the second terminal to each other, wherein the organic insulating layer includes a sealant which attaches the first substrate and the second substrate and surrounds the liquid crystal layer, a diameter of the second hole is greater than a diameter of the first hole, and at least one of the first terminal and the second terminal including an oxide electrode in contact with the connecting material.

15. The structure of claim 14, wherein the second terminal is an oxide electrode in contact with the second surface.

16. The structure of claim 15, further comprising: a detection electrode located on the second surface and connected to the second terminal, wherein a thickness of the second terminal is greater than a thickness of the detection electrode.

17. The structure of claim 14, wherein the second terminal comprises a metal layer in contact with the second surface and an oxide electrode in contact with the metal layer.

18. The structure of claim 14, further comprising: a protection material covering the second terminal.

19. The structure of claim 14, further comprising:

a first interlayer insulating layer located between the first base member and the first terminal, wherein the first terminal comprises a first oxide electrode located on the first interlayer insulating layer.

20. The structure of claim 19, wherein the first terminal comprises a second oxide electrode above the first oxide electrode.

21. The structure of claim 20, further comprising: a second interlayer insulating layer between the first oxide electrode and the second oxide electrode.

22. The structure of claim 20, wherein the second oxide electrode is in contact with the first oxide electrode.

23. The structure of claim 14, wherein the first substrate comprising a third hole which penetrates the first terminal.

* * * * *